United States Patent
Fujita

(10) Patent No.: US 7,251,792 B2
(45) Date of Patent: Jul. 31, 2007

(54) NET LIST CREATING METHOD, NET LIST CREATING DEVICE, AND COMPUTER PROGRAM THEREOF

(75) Inventor: Miyako Fujita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 413 days.

(21) Appl. No.: 10/944,880

(22) Filed: Sep. 21, 2004

(65) Prior Publication Data

US 2005/0257184 A1 Nov. 17, 2005

(30) Foreign Application Priority Data

May 17, 2004 (JP) ............................ 2004-146780

(51) Int. Cl.
*G06F 17/50* (2006.01)
(52) U.S. Cl. ....................... 716/3; 716/1; 716/5; 716/17
(58) Field of Classification Search .................... 716/3, 716/2, 1, 5, 17
See application file for complete search history.

(56) References Cited

U.S. PATENT DOCUMENTS

| | | | | |
|---|---|---|---|---|
| 5,978,304 A | * | 11/1999 | Crafts | ................... 365/230.03 |
| 6,539,506 B1 | * | 3/2003 | Lammers et al. | ........... 714/719 |
| 6,856,167 B2 | * | 2/2005 | Ozguz et al. | .................. 326/41 |
| 2003/0223295 A1 | * | 12/2003 | Ozguz et al. | ............... 365/201 |

* cited by examiner

*Primary Examiner*—Sun James Lin
(74) *Attorney, Agent, or Firm*—Staas & Halsey

(57) ABSTRACT

It is intended to provide net list creating method, net list creating device, and computer program thereof capable of creating net list of memory space by selecting optimum combination of memory macros and providing a control circuit for controlling and making the combination accessible as memory space from a previously registered library so as to realize required memory space. For realizing a target memory with a single memory macro by extending its word width, processing goes on to as follows: target word width of a target memory is larger than maximum macro word width of a memory macro (S5: YES); first word width ratio (WR1), target word width to maximum macro word width, is $2^n$ and first bit width ratio (BR1), bit width of a target memory to bit width of memory macro which has maximum macro word width, is $2^{(-n)}$ or smaller (S9: YES); a memory macro which has maximum macro word width is selected (S11); and a control circuit is selected from a control library (D3) previously provided after branch a.

25 Claims, 16 Drawing Sheets

FLOW OF CONNECTION TO MEMORY MACRO SELECTED IN FIG.1

FLOW OF EMBODIMENT (2)
(MEMORY MACRO SELECTION IN CASE OF WORD EXTENSION(2))

FLOW OF CONNECTION TO MEMORY MACRO SELECTED IN FIG.3

FLOW OF EMBODIMENT (3)
(MEMORY MACRO SELECTION IN CASE OF WORD REDUCTION)

FLOW OF CONNECTION TO MEMORY MACRO SELECTED IN FIG. 5

SPECIFIC EXAMPLE (1) OF CIRCUIT STRUCTURE CREATED IN ACCORDANCE WITH FLOWS OF FIG.1 AND FIG.2

SPECIFIC EXAMPLE (2) OF CIRCUIT STRUCTURE CREATED IN ACCORDANCE WITH FLOWS OF FIG.1 AND FIG.2

SPECIFIC EXAMPLE (1) OF CIRCUIT STRUCTURE CREATED IN ACCORDANCE WITH FLOWS OF FIG.3 AND FIG.4

SPECIFIC EXAMPLE (2) OF CIRCUIT STRUCTURE CREATED IN ACCORDANCE WITH FLOWS OF FIG.3 AND FIG.4

SPECIFIC EXAMPLE (1) OF CIRCUIT STRUCTURE CREATED IN ACCORDANCE WITH FLOWS OF FIG.5 AND FIG.6

SPECIFIC EXAMPLE (2) OF CIRCUIT STRUCTURE CREATED IN ACCORDANCE WITH FLOWS OF FIG.5 AND FIG.6

SPECIFIC EXAMPLE (3) OF CIRCUIT STRUCTURE CREATED IN ACCORDANCE WITH FLOWS OF FIG.5 AND FIG.6

SPECIFIC EXAMPLE (4) OF CIRCUIT STRUCTURE CREATED IN ACCORDANCE WITH FLOWS OF FIG.5 AND FIG.6

FIG. 15 STRUCTURE OF NET LIST CREATING DEVICE DIRECTED TO EMBODIMENT

MEMORY MACRO LAYOUT OF STRUCTURED ASIC

NET LIST CREATING METHOD, NET LIST CREATING DEVICE, AND COMPUTER PROGRAM THEREOF

CROSS-REFERENCE TO RELATED APPLICATIONS

This application is based upon and claims the benefit of priority from each of the prior Japanese Patent Application No. 2004-146780 filed on May 17, 2004, the entire contents of which are incorporated herein by reference.

BACKGROUND OF THE INVENTION

1. Field of the Invention

The present invention relates to creation of net list for realizing circuit structure suitable to required circuit specification by combining IP macros previously provided in a chip frame. More particularly, it relates to net list creating method, net list creating device, and computer program thereof for realizing circuit structure depending on required memory space by combining memory macros in structured ASIC.

2. Description of Related Art

For making their electric appliances distinctive from other competitive products, many electric appliance manufacturers endeavor to develop LSI which realizes unique functions. In case integration degree, operation speed, current consumption are to be focused, ASIC such as standard cells and the like which makes optimum circuit design possible is used. In case it is in developing stage and circuit specification is changeable, or in case required number of LSI is limited, FPGA and the like a user can change circuit structure every time are used.

As higher function design, advancement of higher function design, and shorter product cycle in electric appliance product field go on, longer R&D term and higher R&D costs for ASIC development have been problematic. Furthermore, for FPGA development, in case intended circuits are packaged in a selected kind due to enlargement of circuit scale, especially in case rate of in-use cells becomes higher, convergence characteristic may deteriorate and as a result, there may occur fears to extend a design term and change design specification forcedly.

In such a situation, there has recently been developed ASIC of new architecture which realizes earlier appointed date of delivery and lower development costs. That is, desired circuit structure is realized by such a manner that essential IP macros such as memory macros are previously arranged in a chip frame and IP macros are combined and connected by a certain part of wiring layer depending on user's circuit specification. Thereby, earlier appointed date of delivery and lower development costs are about to come true in electric appliance field for which higher function design has been required.

SUMMARY OF THE INVENTION

In structured ASIC shown in FIG. 16, there are arranged two types of memory macros, namely, two-port structured memory macros 2RW in matrix format within a chip frame, and one-port structured memory macros 1R1W around outer periphery of the chip frame. For realizing required memory space, it is required to a design control circuit which selects memory macros 1R1W and 2RW arranged in an array and controls to make the selected memory macros accessible as memory space.

However, in the above described background art, combination of memory macros for realizing various memory space specification depending on user is not always restricted to one combination but there may be plural combinations in general. That means it is not always guaranteed to realize optimum circuit structure for each case of required memory space. There is a fear that redundant and not optimum selection is made, which is problematic in terms of circuit integration.

Furthermore, since combination of memory macros to be selected depending on required memory space differs, a control circuit is designed suitably every time so as to make selected memory macros accessible as memory space. That is, it is required to design a control circuit which is not originally a function circuit to be realized for LSI. This is problematic in terms of load on design.

The present invention has been made to solve at least one of the problems the above-mentioned prior art has had. The object of the present invention is to provide net list creating method, net list creating device, and computer program thereof capable of creating net list of memory space by selecting optimum combination of memory macros and providing a control circuit for controlling and making the combination accessible as memory space from a previously registered library so as to realize required memory space.

According to a first aspect of the present invention directed to net list creating method, device and computer program thereof, there is provided net list creating method for structuring a target memory by using memory macro(s) previously arranged in each chip frame, the net list creating method comprising: a step of comparing a target word width directed to the target memory and a macro word width directed to the memory macro(s); a step of calculating a first word width ratio, the target word width to a maximum macro word width, and a first bit width ratio, a bit width of the target memory to a bit width of a memory macro that has the maximum macro word width, in case the target word width is larger than a maximum value of the macro word width; and a step of selecting a memory macro that has the maximum macro word width on condition that the first word width ratio is $2^n$ (n: natural number) and the first bit width ratio is $2^{(-n)}$ or lower, or selecting a memory macro that has minimum composing number among required number of memory macros calculated from a product of word width ratio and bit width ratio of the target memory to the memory macro in case the afore-mentioned condition is not satisfied.

The first aspect of the present invention is applicable to a case that a target word width of a target memory and a macro word width previously arranged in a chip frame are compared and the target word width is larger than a maximum value of the macro word width, and so a word width to a memory macro should be extended. Furthermore, when a first word width ratio, the target word width to a maximum macro word width, and a first bit width ratio, a bit width of the target memory to a bit width of a memory macro that has the maximum macro word width, are calculated and in case the first word width ratio is $2^n$ (n: natural number) and the first bit width ratio is same as or smaller than $2^{(-n)}$, a memory macro which has maximum macro word width is selected, whereby a target memory is structure. In case the above condition is not satisfied, a product of word width ratio and bit width ratio of the target memory to the memory macro is calculated and a memory macro that has minimum composing number is selected to compose a target memory.

Thereby, in case the target word width is larger than the macro word width and the target memory can be obtained by extending the macro memory to word width direction, it is firstly judged whether or not the two conditions, namely, first word width ratio is $2^n$ (n: natural number) and, the first bit width ratio is same as or smaller than n $2^{(-n)}$ are satisfied, with reference to the macro memory which has the maximum macro word width, the largest word width among macro memories. In case the above two conditions are satisfied, the target memory can be composed by allocating one memory macro which has maximum macro word width to it. That is, the target memory can be composed with minimum composing number.

Furthermore, in case the above two conditions are not satisfied, word width ratio and bit width ration are calculated, then it is judged whether or not extension in bit direction is required in addition to extension in word direction, and a product of the word width ratio and the bit width ratio is calculated to obtain required number of memory macros for realizing the target memory. Through the calculation, minimum composing number of memory macros is selected and the target memory can be composed with minimum composing number.

According to a second aspect of the present invention directed to net list creating method, device and computer program thereof, there is provided net list creating method for structuring a target memory by using memory macro(s) previously arranged in each chip frame, the net list creating method comprising: a step of comparing a target word width directed to the target memory and a macro word width directed to the memory macro(s); a step of calculating a second bit width ratio, a bit width of the target memory to a bit width of the memory macro, in case the target word width is same as a maximum value of the macro word width or lower and a memory macro has a word width same as or wider than the target word width; a step of checking whether or not division of the memory macro for extending a bit width is possible in case the second bit width ratio is larger than 1, a step of selecting a memory macro that has minimum composing number among combinations of the second bit width ratio and dividable number of the memory macro in case the memory macro is dividable; and a step of selecting a memory macro of which macro word width is closest to the target word width in case there is a memory macro in which the second bit width ratio is 1 or in case the second bit width ratio is larger than 1 and division of a memory macro is impossible.

The second aspect of the present invention is applicable to a case that a target word width of a target memory and a macro word width previously arranged in a chip frame are compared and the target word width is same as or smaller than a maximum value of the macro word width, and so a word width to a memory macro should be reduced. Furthermore, when a second bit width ratio, bit width of a target memory to bit width of a memory macro which has word width same as or larger than target word width, is calculated and in case the second bit width ratio is larger than 1, it is checked whether or not memory macro can be divided for extending bit width. In case it is dividable, a memory macro of minimum composing number is selected from combinations of the second bit width ratio and dividable number of memory macro to compose the target memory. In case there is a memory macro in which the second bit width ratio is 1 or in case the second bit width ratio is larger than 1 and division of a memory macro is impossible, a memory macro of which macro word width is closest to the target word width is selected to compose the target memory.

Thereby, by selecting a memory macro of which macro word width is same as or larger than the target word width, the memory macro is reduced in word direction and the target memory is composed. Furthermore, in case the second bit width ratio is larger than 1 and the target memory is extended in bit direction with reference to the memory macro, it is firstly judged whether or not division for extending the memory macro in bit direction is possible. If it is dividable, a memory macro of minimum composing number is selected based on dividable number corresponding to number of extension in bit direction obtained by the division of the memory macro and the second bit width ratio. Thereby, the target memory can be composed with minimum composing number.

The above and further objects and novel features of the invention will more fully appear from the following detailed description when the same is read in connection with the accompanying drawings. It is to be expressly understood, however, the drawings are for the purpose of illustration only and are not intended as a definition of the limits of the invention.

DETAILED DESCRIPTION OF THE PREFERRED EMBODIMENTS

Figure 1:
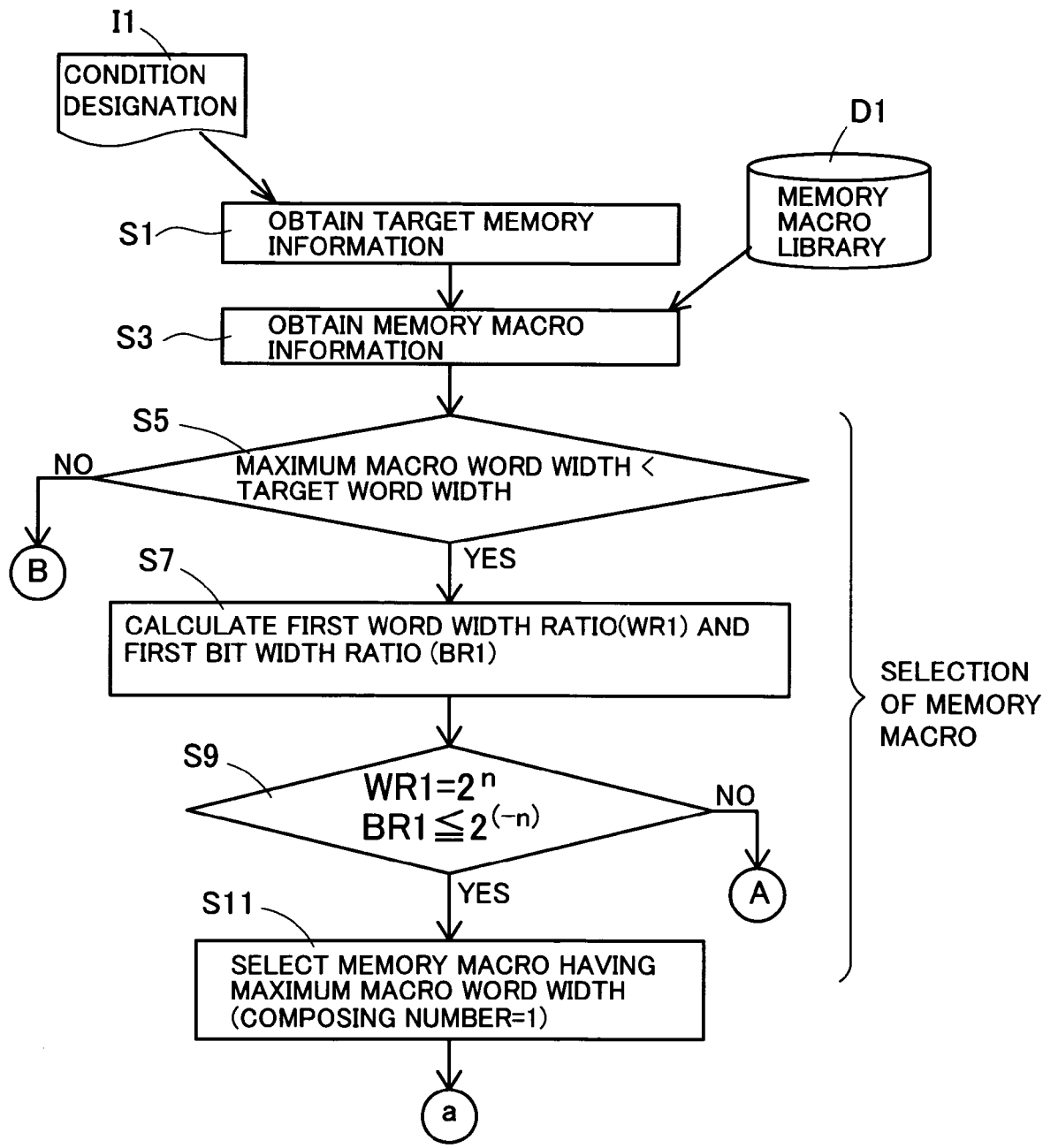
FIG. 1 is a flow (1) of an embodiment (memory macro selection in case of word extension (1))

FIG. 1 shows a flow of an embodiment which illustrates procedures of net list creation of the present invention. When condition designation (I1) is inputted by an input device and the like, target memory information is obtained (S1) and memory macro information is obtained from memory macro library (D1), (S3). Target memory information and memory macro information here mean structure information such as word width and bit width for composing a memory and information including control information such as the number of input/output ports and data mask information of each input/output bit. Furthermore, condition designation (I1) includes information of chip frame for realizing a target memory. Furthermore, memory macro information is previously stored in the memory macro library (D1) by each chip frame. Information concerning memory macro built in an object chip frame is read from a memory macro library (D1) depending on a chip frame designated by condition designation (I1).

After memory macro information is obtained (S3), processing goes on to memory macro selection procedure. Firstly, there will be described a flow of a case that word width of a target memory is extended with reference to a memory macro (termed as word extension, hereinafter) and a target memory can be composed of a single memory macro.

A macro word width largest (termed as maximum macro word width, hereinafter) among widths of memory macros (termed as macro word width hereinafter) is extracted from memory macro information obtained at (S3) and the extracted maximum macro word width and a word width of a target memory (termed as target word width, hereinafter) are compared. In case the target word width is same as or smaller than the maximum macro word width (S5: NO), it holds true of a case that a word width of the target memory is not extended with reference to the memory macro (termed as word reduction, hereinafter) and the processing is branched off to B in FIG. 1. Brach B will be described later by referring to FIG. 5 and FIG. 6.

In case the target word width is larger than the maximum macro word width (S5: YES), a first word width ratio (WR1), a target word width to a maximum macro word width, and a first bit width ratio (BR1), a target memory bit width to a bit width of a memory macro which has a maximum macro word width, are calculated (S7). Next, it is judged whether or not the calculated first word width (WR1) and first bit width ratio (BR1) satisfy both conditions, namely, $WR1=2^n$ and $BR1 \leqq 2^{(-n)}$, (S9). It is to be noted n is a natural number. In case the above conditions are not satisfied (S9: NO), it holds true of a case that word extension cannot be made with a single memory macro and the processing is branched off from A of FIG. 1 to procedure directed to FIG. 3 and FIG. 4, which will be described later.

In case the both of the conditions are satisfied (S9: YES), a memory macro which has a maximum macro word width is selected (S11). Here, a target memory can be composed with a single selected memory macro.

Figure 2:
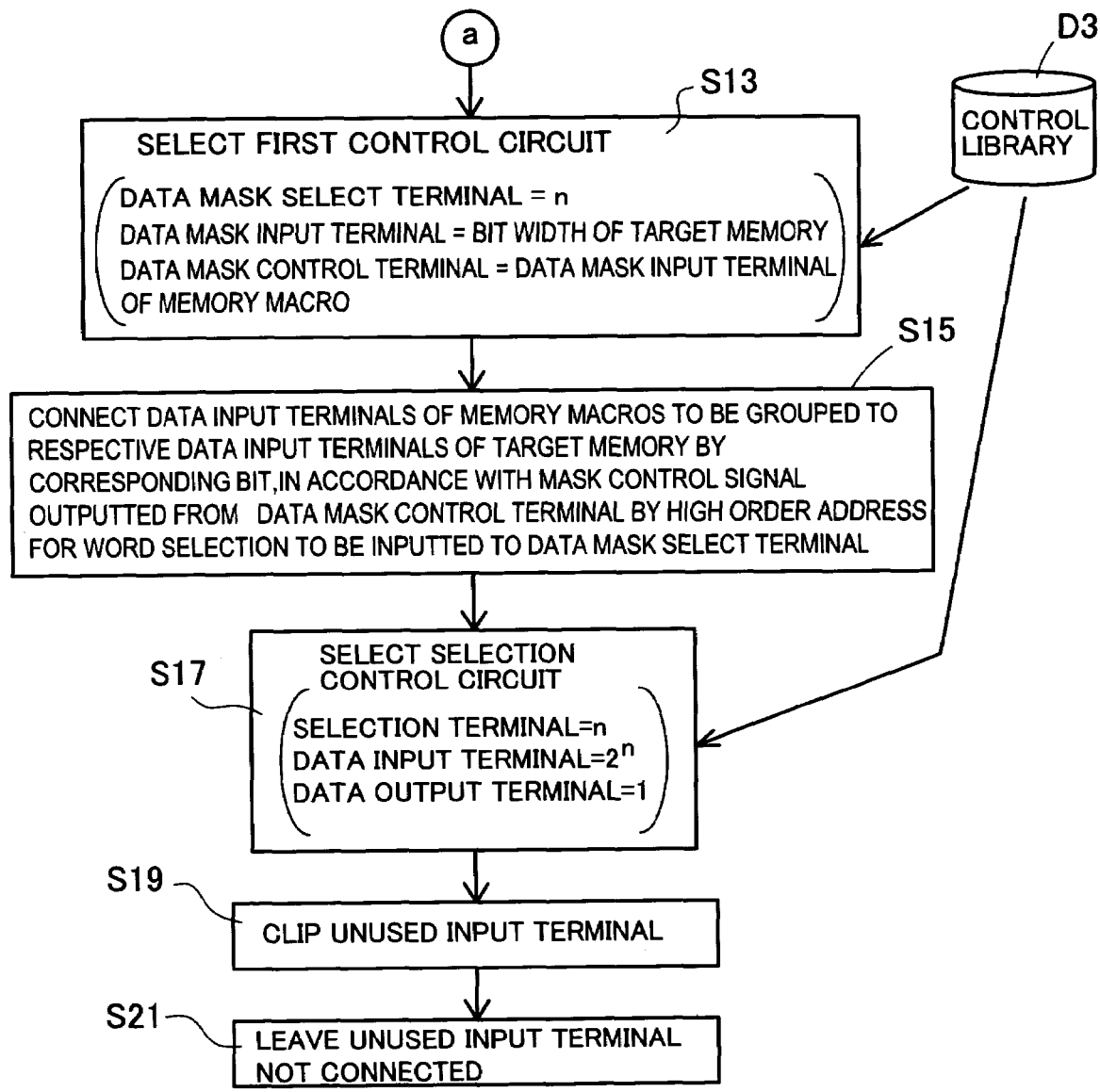
FIG. 2 is a flow of connection to memory macro selected in FIG. 1.

Connection including a control circuit is conducted in procedures after the branch a, depending on a selected memory macro. FIG. 2 shows the connection procedure. The control circuit is a circuit provided for securing interface of input/output terminal between the target memory and the selected memory macro. Since control information such as word/bit structure, the number of input/output ports, data mask information of each input/output bit, and the like, differ between the target memory and the selected memory macro, it is necessary to adjust between input/output terminals of the target memory and those of the memory macro. More specifically, there is required a selection control circuit which interfaces a first control circuit for controlling bit width to be activated for word extension and a data output terminal of the memory macro to a data output terminal of the target memory. In the present embodiment, the above those control circuits are stored in a control library (D3) previously provided by each chip frame. Since a memory macro library (D1) is provided for each chip frame and memory macro structure to be stored is previously determined, control circuits required for each memory macro are determined automatically. In the control library (D3), there is stored net list of control circuit for realizing interface assumed depending on memory macro library (D1).

In FIG. 2, the first control circuit is firstly selected for taking interface of a signal at input side (S13). The first control circuit is a circuit for appropriately selecting a mask control signal to be masked by each bit so as to meet bit width of a memory macro with that of a target memory. Since the first control circuit selected from the control library (D3) controls data mask input terminals number of which corresponds to bit width of the memory macro one by one, the first control circuit has terminals as many as the number of the data mask input terminals, as data mask input terminals. Furthermore, for bit width of the target memory, data needs masking bit by bit. Therefore the first control circuit has terminals as many as the number of data mask input terminals of the target memory, as data mask input terminals. Furthermore, the first control circuit has n terminals as data mask control terminals so as to select which data mask control terminal should output a mask control signal for masking predetermined bit of the memory macro. In case the first control circuit has data mask selection terminal for the n terminals, it is convenient to reduce bit width smaller than $2^{(-n)}$ as first bit width ratio BR1. The bit width of the memory mask can be grouped $2^n$ by $2^n$, by an n-bit signal to the data mask selection terminals. By identifying each group, input/output of data becomes possible with respect one the groups. In addition to extending word width to $2^n$, reducing bit width to same as or smaller than $2^{(-n)}$ is also possible.

Nest, there is conducted processing for data input terminals of the memory macro to be grouped by $2^n$ bit width (S15). A high-order address of n-bit highest is inputted to the data mask selection terminal so as to identify word structure to be extended by the first word width ratio (WR1). Upon input of the high-order address, a mask control signal is outputted from the data mask control terminal. Data input terminals of a memory macro grouped $2^n$ by $2^n$ depending on a mask control signal are collected together bit by bit which corresponds to each group and connected to each data input terminal of a target memory in sharable. Thereby, whichever of group may be selected, data input from data input terminals of a target memory becomes possible and bit width can be reduced same as or smaller $2^{(-n)}$.

Next, a selection control circuit is selected from the control library (D3) so as to take interface of a data signal at output side (S17). A selection control circuit is provided for each data output terminal of a target memory and a single data output terminal is connected to a data output terminal of the target memory. Furthermore, $2^n$ data input terminals are connected to a data output terminal which corresponds to predetermined data input terminal grouped by $2^n$ to be connected each data input terminal of a target memory in sharable. Furthermore, there is provided n selection terminals for selecting $2^n$ data input terminals to be connected to the single data output terminal. Thereby, among data output terminals at predetermined bit position on bit width grouped by $2^n$ for memory macro, a terminal depending on a group to be designated depending on high-order address can be connected to a data output terminal of a target memory.

Among respective terminals of a memory macro, unused input terminals are clipped at signal level for making the terminals in inactive (S19), and unused output terminals are not connected to terminals of a target memory but set in floating state (S21).

Figure 3:
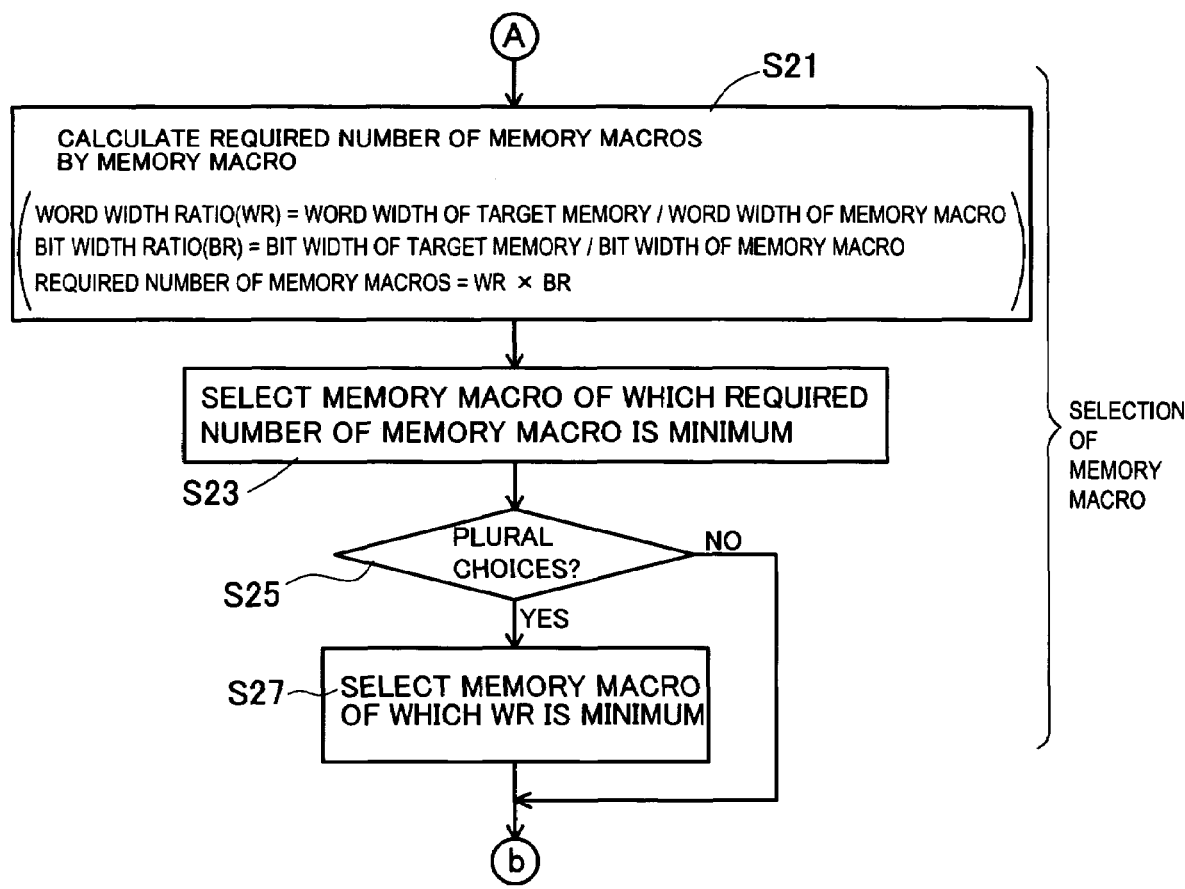
FIG. 3 is a flow (2) of the embodiment (memory macro selection in case of word extension (2))

FIG. 3 for illustrating net list creating procedure of the present invention relates to a case that word extension for a target memory is made for a memory macro and a target memory is composed of plural memory macros. In case of branch A (S9: NO) where two conditions, first word width ratio (WR1=2) and first bit width ratio (BR1≤$2^{(-n)}$), are not satisfied at S9 in FIG. 1, the processing goes on to procedures of FIG. 3.

Firstly, required number of memory macros is calculated by memory macro (S21). More specifically, word width ration (WR), word width of a target memory to word width of a memory macro, and bit width ration (BR), bit width of a target memory to bit width of a memory macro, are calculated and further calculated required number of memory macros from a product of those (WR×BR). From word width ratio (WR) and bit width ratio (BR), multiplication of word/bit structure of a target memory with reference to a memory macro is calculated, with respect to word direction and bit direction. Required number of memory macros, i.e., a product of (WR×BR), corresponds to required number in case a target memory is structured with memory macros.

Next, memory macros of which required composing number is minimum are selected (S23). Since word/bit structure differs by memory macro, required number of memory macro for realizing a target memory differs by memory macro. In S23, memory macros for realizing a target memory with minimum composing number are selected.

In case memory macros selected at S23 are a single type (S25: NO), this memory macro is selected for composing a target memory. In case memory macros are plural types (S25: YES), memory macros of which word width ratio (WR) is minimum is selected (S27). For realizing word extension corresponding to word width ratio (WR), there must be provided a first control circuit and a selection control circuit. By selecting a memory macro of which word width ratio (WR) is minimum among plural types of memory macros, circuit scale of the first control circuit and the selection control circuit can be suppressed. By providing minimum composing number of selected memory macro, a target memory can be composed.

Figure 4:
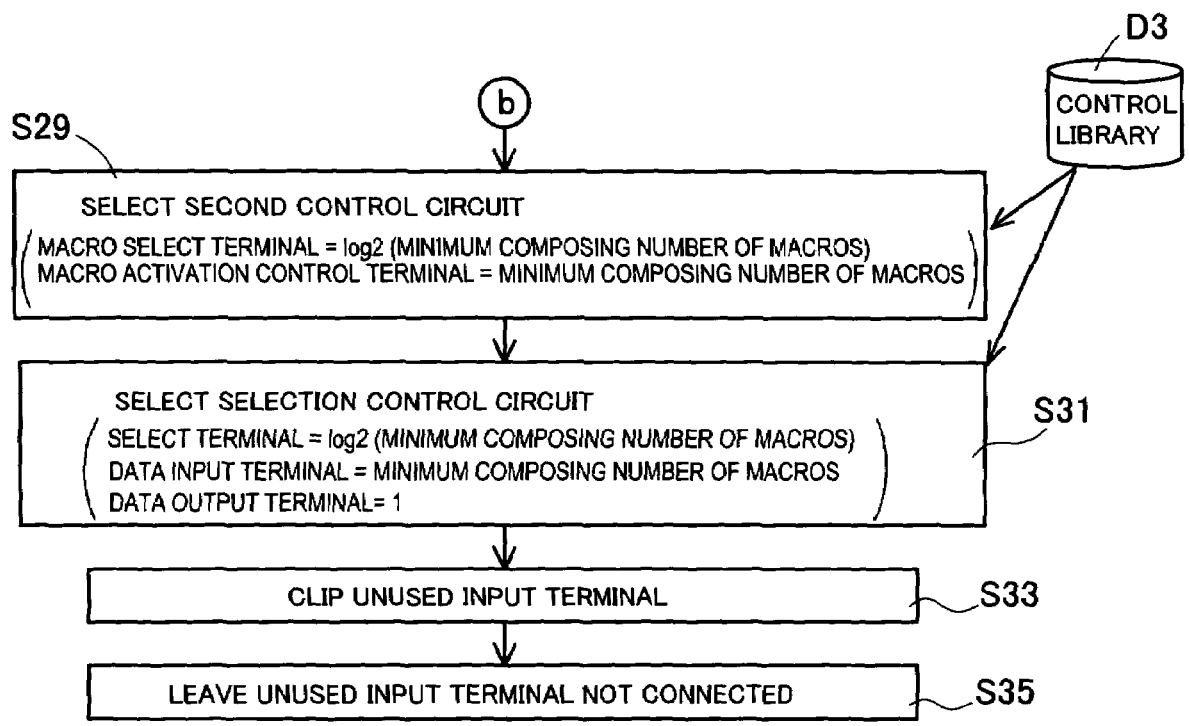
FIG. 4 is a flow of connection to memory macro selected in FIG. 3.

Including the control circuit, connection is made after brunch b depending on selected memory macros. FIG. 4 shows processing after brunch b. In this case, since a target memory is composed of plural selected memory macros, it is required to allocate memory macros to be activated depending on access region to the target memory. That is, a second control circuit for controlling memory macros to be activated and a selection control circuit for interfacing data output terminals of memory macros to data output terminals of a target memory are required. In the present embodiment, those control circuits are stored in the control library (D3) previously provided for each chip frame. Since a memory macro library (D1) is provided for each chip frame and structure of memory macros to be stored is previously determined, control circuits required for each memory macro are also determined. In the control library (D3), net list of control circuit for realizing interface assumed depending on memory macro library (D1) is stored.

In FIG. 4, a second control circuit is firstly selected for selecting memory macros to be activated (S29). By providing the second control circuit, there can be secured interface between input-side terminal of a target memory and input-side terminals of plural memory macros. The second control circuit is a circuit for selecting memory macros to be activated out of plural memory macros allocated for realizing word width of a target memory for word extension. The second control circuit selected from the control library (D3) has terminals which is many enough to distinguish memory macros minimum composing number as macro selection terminal in order to distinguish minimum composing number of required memory macro when a target memory is composed. More specifically, it is log2 (minimum composing number of macros). Furthermore, since each memory macro is controlled and activated depending on signal inputted to a macro selection terminal, there are provided macro activation control terminals as many as minimum composing number of macros.

As to bit extension, memory macros corresponding to bit width ratio (BR) of memory macros may be activate at the same time among plural memory macros allocated for realizing bit width of a target memory.

Next, a selection control circuit is selected from the control library (D3) so as to secure interface of a data signal at output side (S31). A selection control circuit is provided for each data output terminal of a target memory and a single data output terminal is connected to a data output terminal of a target memory. Furthermore, a data input terminal has terminals of macros of which composing number is minimum and each data output terminal of each memory macro composing a target memory is connected to the data input terminal. Furthermore, there is provided log2 (macros of minimum composing number) of selection terminals for selecting a data output terminal of memory macros of minimum composing number to be connected to a single data output terminal. Thereby, a data output terminal of activated memory macro among plural memory macros composing a target memory can be connected to a data output terminal a target memory.

Among each terminal of memory macros, an unused input terminal is clipped at signal level for making the terminal in inactive (S33), and unused output terminal is not connected to terminals of a target memory but set in floating state (S35).

Figure 5:
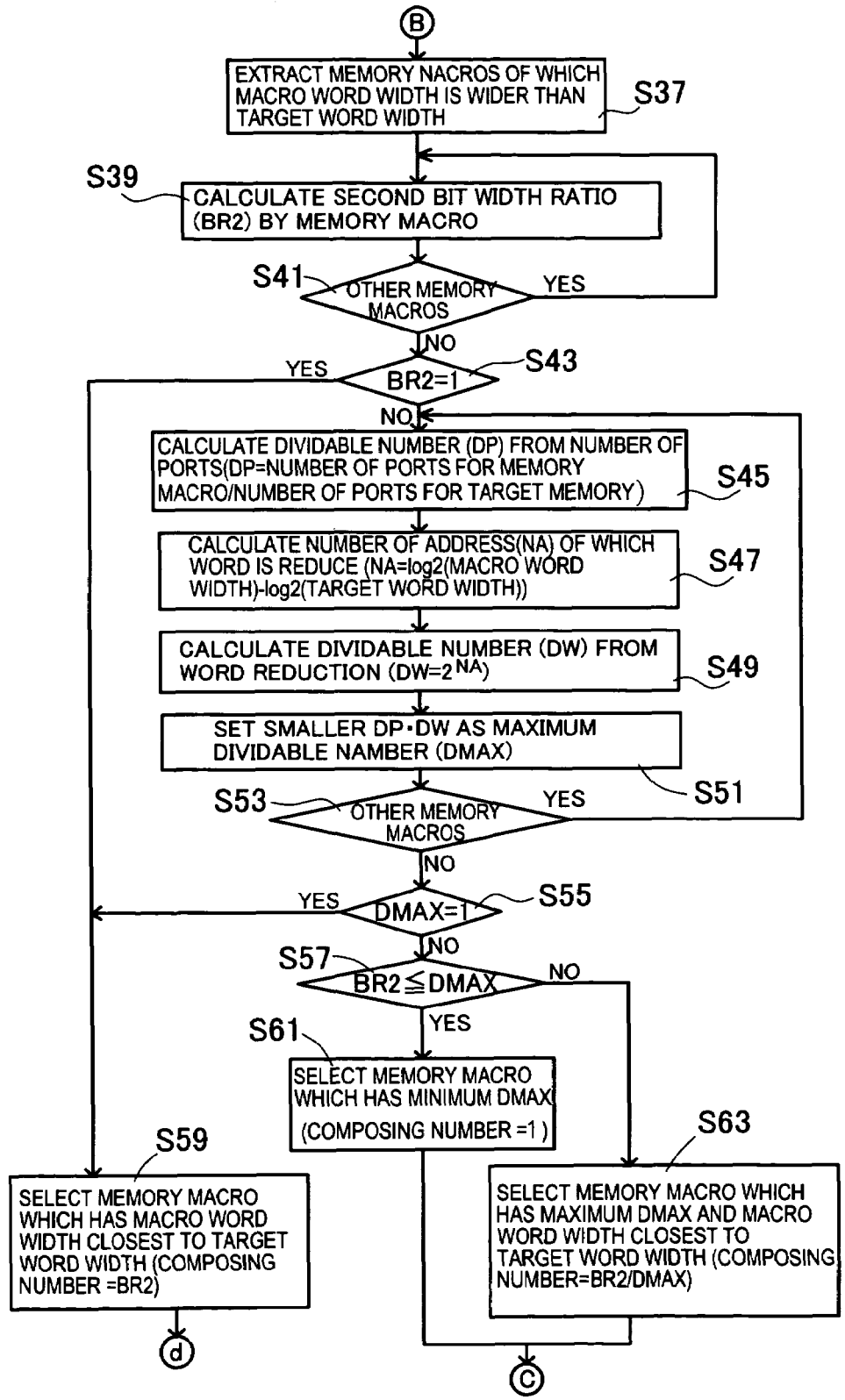
FIG. 5 is a flow (3) of the embodiment (memory macro selection in case of word reduction)

FIG. 5 for illustrating net list creating procedure of the present invention relates to a case that word width of a target memory with reference to memory macro is not extended (termed as word reduction hereinafter). In case of branch B (S5: NO) where target word width is same as or smaller than maximum macro word width, the processing goes on to procedures of FIG. 5.

Firstly, memory macros which have macro word width same as or larger than target word width is extracted (S37). Thereby, there are extracted memory macros capable of composing a target memory by word reduction. Next, second bit width ratio (BR2), bit width of a target memory to bit width of memory macros, is calculated for each memory macro (S39). The procedure of S39, calculation of second bit width ratio (BR2), is made to all of extracted memory macro (S41).

In case a memory macro of which calculated second bit width ratio is 1 (BR2=1) exists (S43: YES), a memory macro which has macro word width closest to target word width is selected (S59). Since the selected memory macro is a macro of which macro word width is larger than target word width, the memory macro is not extended in word direction. In that case, since second bit width ratio is 1 (BR2=1), extension in bit direction is not required and a target memory can be composed by providing a single selected memory macro.

In case a memory macro of which calculated second bit width ratio is 1 (BR2=1) does not exist (S43: NO), dividable number of ports (DP), namely, number of ports of memory macros to number of ports of a target memory, is calculated based on number of input/output ports of memory macros and number of input/output ports of a target memory (S45). Dividable number (DP) is obtained by calculating a multiple of possible bit extension from ration of ports. As to address signals recognizable each of plural ports, by giving address signals different by port, bit extension depending on number of ports can be executed accompanying word reduction corresponding to allocated address. For example, in case a memory macros has two ports with reference to a target memory of single port, two time bit extension can be executed accompanying ½ or lager word reduction.

Next, number of high order address (NA) for recognizing word structure object to word reduction is calculated (S47). The calculation at S47 can be expressed with NA=log2 (macro word width)−log2 (target word width). Dividable number derived from word reduction (DW=2NA) can be calculated from number of high-order address (NA), (S49). Calculation of dividable number (DW) is to obtain limitation by word reduction in case bit extension is executed by parallel operation among ports. In case bit extension is executed by parallel operation among ports, address different by port is allocated so as to make each port distinguishable and a memory region to be accessed by each port must be separated. Therefore, bit extension determined by number of ports must be executed within a range of number of ports recognizable with number of high-order address (NA) not required to be recognizable due to word reduction.

This limitation is set at next step at S51. That is, dividable number (DP) and dividable number (DW) are compared and smaller one is set as maximum dividable number (DMAX), (S51). In case dividable number (DP) is smaller than dividable number (DW), size of bit extension is determined by number of ports but not by size of word reduction. On the contrary, in case dividable number (DP) is larger than dividable number (DW), size of bit extension keeps up with size of word reduction. The procedures (S45) through (S51) are conducted for all of the extracted memory macros (S53).

In case maximum dividable number (DMAX) is calculated for each memory macro and a memory macro of which maximum dividable number is 1 (DMAX=1) exists (S55: YES), a memory macro of which macro word width is closest to target word width is selected (S59). Since the selected memory macro is a macro of which macro word width is larger than target word width, the memory macro is not extended in word direction. Furthermore, Since maximum dividable number is 1 (DMAX=1), the selected memory macro cannot be divided at the time of bit extension. Therefore, a target memory is composed of memory macros as many as number corresponding to second bit width ratio (BR2) calculated at (S39).

In case a memory macro of which maximum dividable number (DMAX) is 1 does not exist (S55: NO), second bit width ratio (BR2) and maximum dividable number (DMAX) is compared (S57). In case maximum dividable number (DMAX) is same as or larger than second bit width ratio (BR2) (S57: YES), a memory macro which has the smallest maximum dividable number (DMAX) is selected (S61). Thereby, bit extension can be executed by division of memory macro and a target memory can be composed with composing number 1. Furthermore, in case maximum dividable number (DMAX) is smaller than second bit width ratio (BR2) (S57: NO), a memory macro of which macro word width is closest to target word width is selected from memory macros which have largest maximum dividable number (DMAX) is selected (S63). That is, maximum bit extension is executed by dividing memory macros and plural memory macros are supplemented for lacked portion to compose a target memory. Composing number is obtained by calculating a division of second bit width ration (BR2) by maximum dividable number (DMAX).

Figure 6:
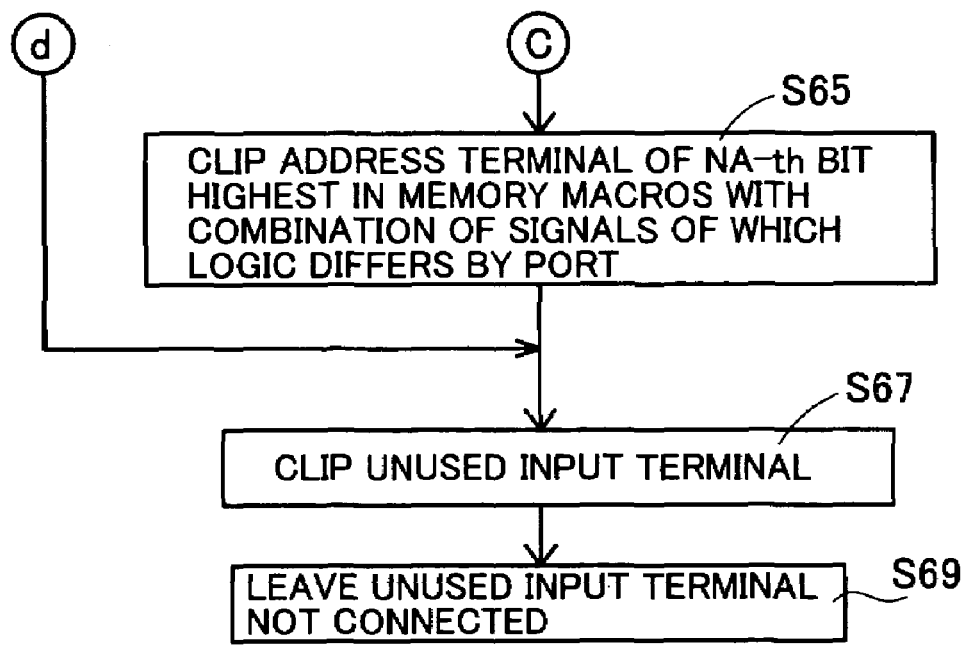
FIG. 6 is a flow of connection to memory macro selected in FIG. 5.

Connection of memory macros selected at (S59) and connection memory macros selected at (S61, S63) are made at branch d and branch c, respectively. FIG. 6 shows connection procedures. As to memory macros branched off to branch c, address terminals of which bits is as many as number of high-order addresses (NA) for recognizing word structure object to word reduction from the highest-order is clipped by signals of which logic combination differs by port (S65). Thereby, address different by port is allocated and memory region to be accessed by each port can be separated.

For memory macros to which procedure of (S65) is applied at branch c and memory macros branched off to branch d, an unused input terminal among each terminal of memory macros is clipped at signal level for making the unused input terminal inactive (S67) and an unused output terminal is set in floating state without connecting to a terminal of a target memory (S69).

Hereinafter, there will be described a specific example of connection relation of circuits at the time of structuring a target memory with selected memory macros in accordance with flows shown in FIG. 1 through FIG. 6.

Figure 7:
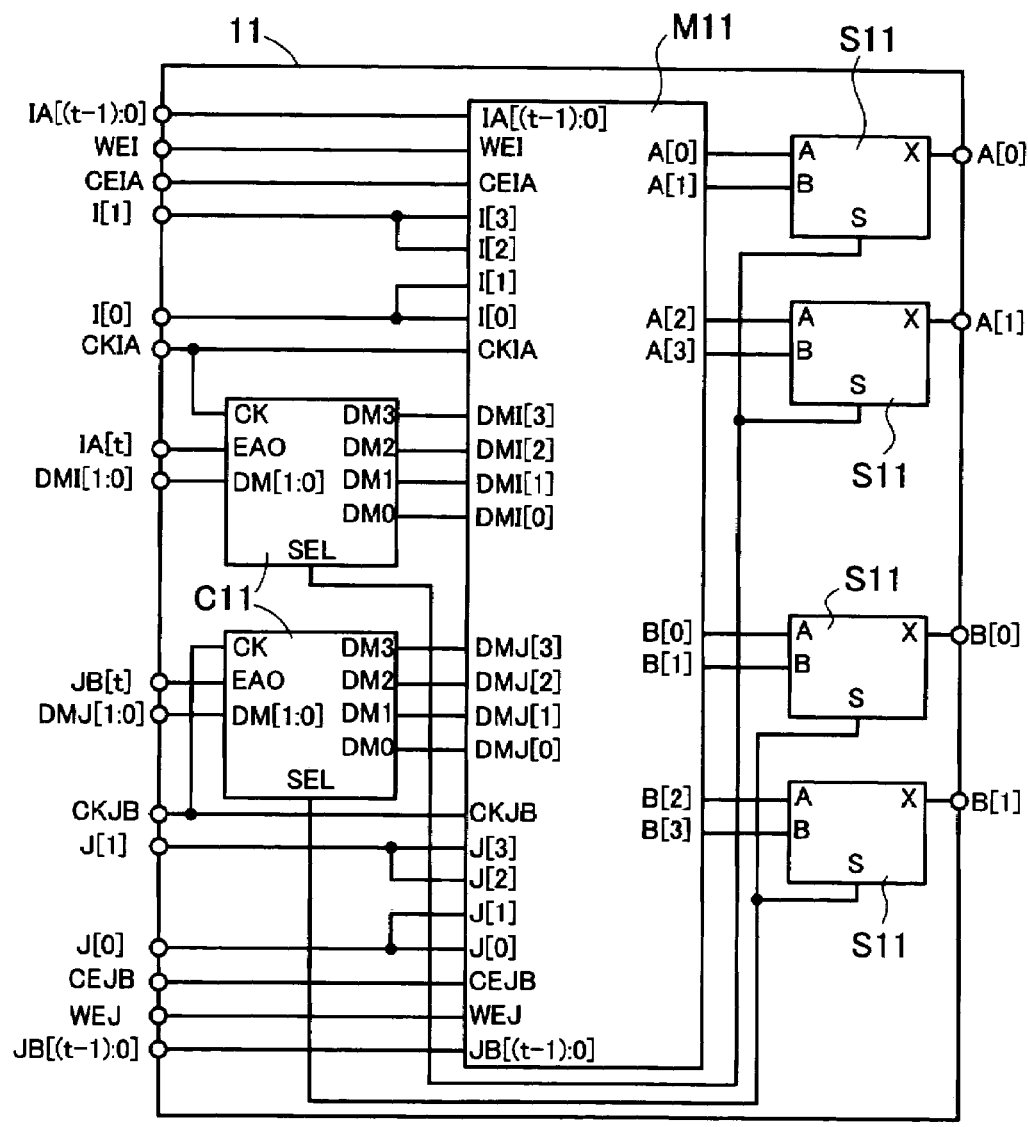
FIG. 7 is a specific example (1) of circuit structure created in accordance with the flows of FIG. 1 and FIG. 2.

FIG. 7 shows a specific example (1) of circuit structure created in accordance with flows of FIG. 1 and FIG. 2. FIG. 7 is a case that word extension for memory macros is made and a target memory can be structured with single memory macro. More specifically, it is a case that a target memory 11 is 8096 words/2 bits with two-port input/output structure and a memory macro M11 is 4096 words/4 bits with two-port input/output structure.

Here, first word width ratio (WR1) is WR1=8096/4096=2, first bit width ratio (BR1) is BR1=4/2=2, wherein it is satisfied n=1. Therefore, there is provided a first control circuit C11 of which data mask selection terminal is single terminal (EA0), data mask input terminals are two terminals (DM[1:0]), and data mask control terminal are four terminals (DM0 through DM3), for each port. Furthermore, there is provided a selection control circuit S11 of which selection terminal is a single terminal (S), data input terminals are two terminals (A,B), and data output terminal is a single terminal (X), for each data output terminal (A/B[0], A/B[1], A/B[2], and A/B[3]) of a memory macro M11.

It is to be noted that FIG. 7 shows a case that a selection terminal (S) is controlled by a control terminal (SEL) of the first control circuit C11. A control terminal (SEL) is a signal which changes depending on signal level to a data mask selection terminal (EA0). It is also possible to input highest-order address (IA/JB[t]) which has been inputted to a data mask selection terminal (EA0), as an input signal to a selection terminal (S).

Highest-order address (IA/JB[t]) has been inputted to a data mask selection terminal (EA0) of the first control circuit C11, and depending on signal level, a mask control signal is outputted to any one of combinations of two terminals of data mask control terminals, namely, DM0 and DM2, or DM1 and DM3, or DM0 and DM3, or DM1 and DM2. At this stage, data input terminals (with combinations of I/J[0] and I/J[1], and I/J[2] and I/J[3]) of a memory macro M11 are connected to data input terminals I/J[0] and I/J[1] of a target memory 11 in sharable. Depending on a mask control signal outputted from the first control circuit C11, two-bit data (I/J[0] and I/J[1]) of the target memory 11 are inputted to two of the four data input terminals (above-mentioned combination among I/J[0] through I/J[3]) of the memory macros M11, further inputted to each selection control circuit S11 from the data output terminals, and then outputted from data output terminals (A/B[0], A/B[1]) of the target memory 11. Highest-order address (IA/JB[t]) is added to double word selections and bit structure of the memory macro M11 is reduced to ½, whereby two times of word extension and ½ of bit reduction are realized in a single memory macro M11.

Figure 8:
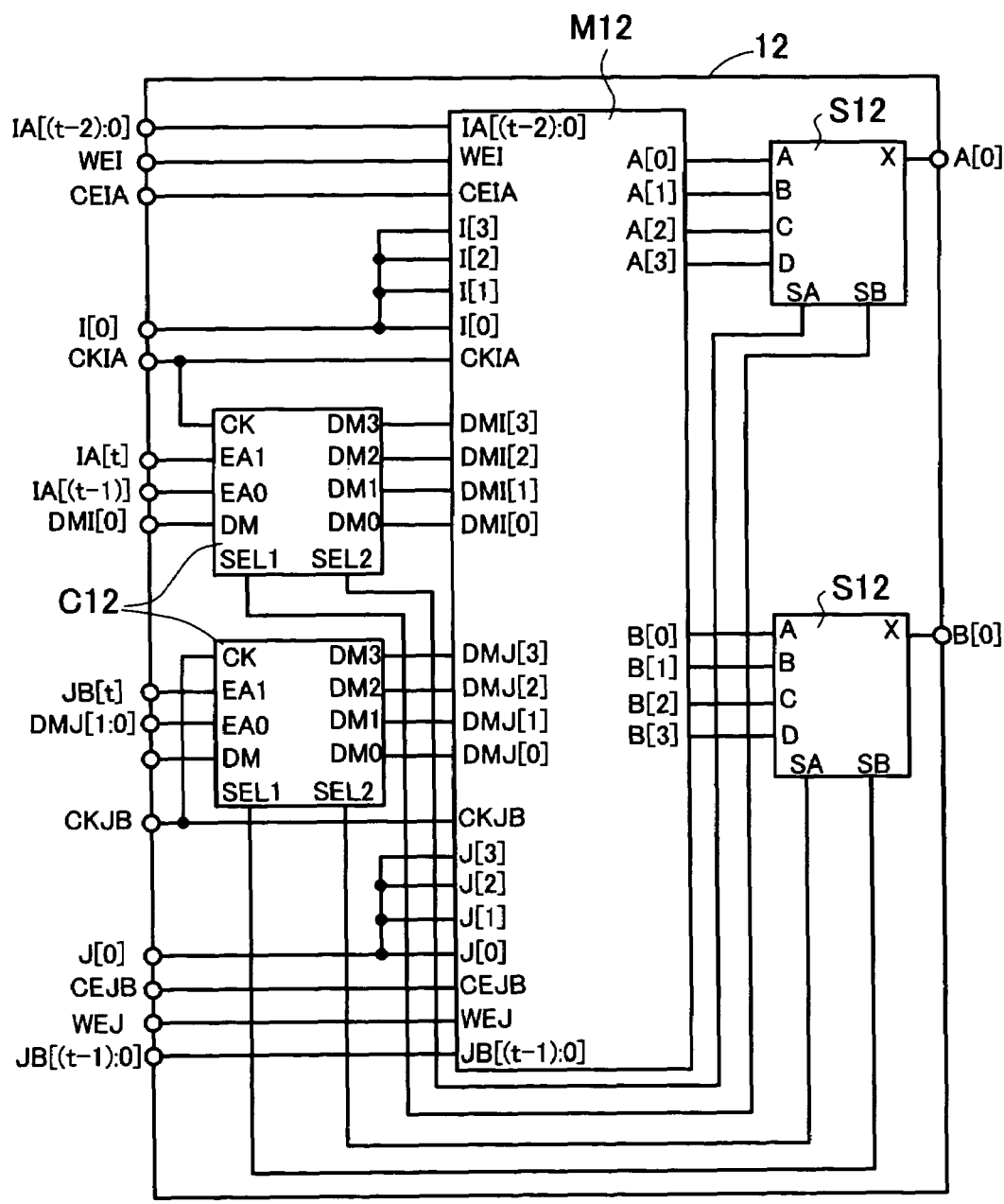
FIG. 8 is a specific example (2) of circuit structure created in accordance with the flows of FIG. 1 and FIG. 2.

FIG. 8 shows a specific example (2) of circuit structure created in accordance with flows of FIG. 1 and FIG. 2. FIG. 8 is a case that word extension for memory macros is made and a target memory can be structured with single memory macro. More specifically, it is a case that a target memory 12 is 16384 words/1 bit with two-port input/output structure and a memory macro M12 is 4096 words/4 bits, whereby circuit structure similar to FIG. 7 can be realized.

Here, first word width ratio (WR1) is WR1=16384/4096=4, first bit width ratio (BR1) is BR1=1/4, wherein it is satisfied n=2. Therefore, there is provided a first control circuit C12 of which data mask selection terminals are two terminals (EA0, EA1), data mask input terminals is single terminal (DM), and data mask control terminal are four terminals (DM0 through DM3), for each port. Furthermore, there is provided a selection control circuit S12 of which selection terminal are two terminals (SA, SB), data input terminals are four terminals (A through D), and data output terminal is a single terminal (X), for each data output terminal (A/B[0]).

It is to be noted that FIG. 8 shows a case that selection terminals (SA, SB) are controlled by control terminals (SEL0, SEL1) of the first control circuit C12. Control terminals (SEL0, SEL1) are signals which change depending on signal level to data mask selection terminals (EA0, EA1). It is also possible to input highest-order address (IA/JB[t], IA/JB[t−1]) which have been inputted to data mask selection terminals (EA0, EA1), as input signals to selection terminals (SA, SB).

Two-bit highest-order address (IA/JB[t], IA/JB[t−1]) have been inputted to data mask selection terminals (EA0, EA1) of the first control circuit C12, and depending on signal level, a mask control signal is outputted to three of the four terminals of data mask control terminals (DM0 through DM3). At this stage, data input terminals (I/J[0] through I/J[3]) of a memory macro M12 are connected to a data input terminal (I/J[0]) of a target memory 12 in sharable. Depending on a mask control signal outputted from the first control circuit C12, one-bit data (I/J[0]) of the target memory 12 is inputted to any one of the four data input terminals (I/J[0] through I/J[3]) of the memory macros M12, further inputted to each selection control circuit S12 from a data output terminal, and then outputted from a data output terminal (A/B[0]) of the target memory 12. Two-bit highest-order address (IA/JB[t], IA/JB[t−1]) are added to make word selections four times and bit structure of the memory macro M12 is reduced to ¼, whereby four times of word extension and ¼ of bit reduction are realized in a single memory macro M12.

Figure 9:
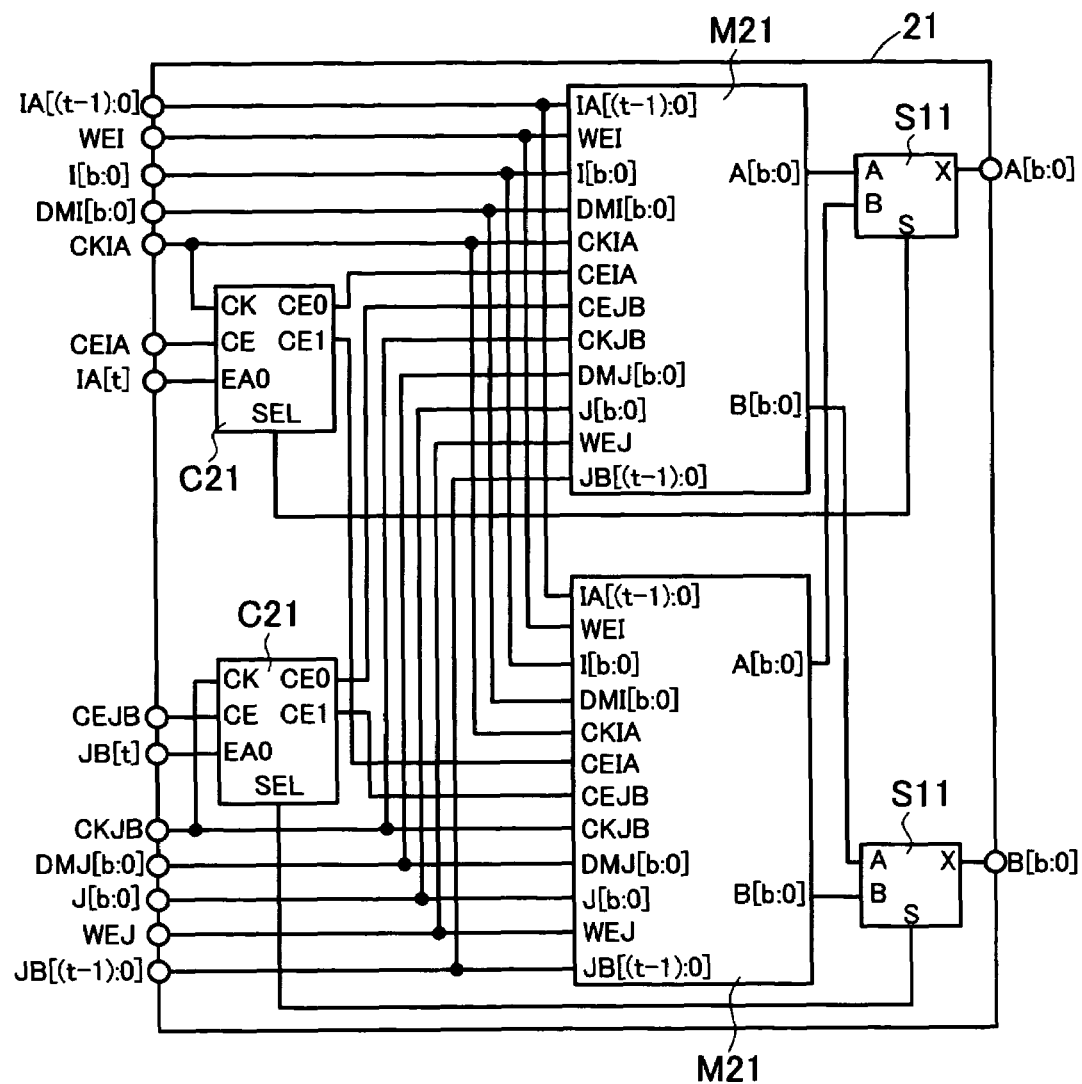
FIG. 9 is a specific example (1) of circuit structure created in accordance with the flows of FIG. 3 and FIG. 4.

FIG. 9 shows a specific example (1) of circuit structure created in accordance with flows of FIG. 3 and FIG. 4. FIG. 9 is a case that word extension for memory macros is made and a target memory is structured with plural memory macros. More specifically, it is a case that a target memory 21 has two-port input/output structure and word extension is made two times while bit width is not extended.

Since the condition of (S9) in FIG. 1 is not satisfied, word width ratio (WR) and bit width ratio (BR) are calculated ((S21) in FIG. 3). The specific example of FIG. 9 is a case that WR=2, BR=1. Minimum composing number is satisfied by structure of two sets of memory macros M21, M21 extended in word direction. Therefore, a second control circuit C21 which has a single terminal of macro selection terminal (EA0) and two terminals of macro activation control terminals (CE0, CE1) is provided for each port. Furthermore, a selection control circuit S11 which has a single terminal of selection terminal (S), two terminals of data input terminals (A, B), and a single terminal of data output terminal (X) is provided for each port of data output terminal (A/B[b:0]) for two sets of memory macro M21, M21.

The second control circuit C21 has an enable terminal (CE) to be connected to an enable terminal (CEIA/CEJB) of a target memory 21. Similar to the case of FIG. 7, the selection terminal (S) of the selection control circuit S11 is connected to the control terminal (SEL) of the second control circuit C21. It is also possible to input highest-order address (IA/JB[t]) which has been inputted to the macro selection terminal (EA0) as an input signal to the selection terminal (S).

Highest-order address (IA/JB[t]) has been inputted to the macro selection terminal (EA0) of the second control circuit C21 and either one of the macro activation control terminals (CE0, CE1) is activated depending on signal level. The macro activation control terminals (CE0, CE1) are connected to enable terminals (CEIA/CEJB) of each memory macro M21 and either one of the memory macros M21 is activated. Two sets of memory macro M21, M21 are distinguished depending on highest-order address (IA/JB[t]) and word structure is extended double. Furthermore, the data input terminals (A, B) of the selection control circuit S12 are connected to data output terminals (A/B[b:0], A/B[b:0]) of the two sets of memory macro M21, M21 for each port. Thereby, data from two sets of memory macro M21, M21 to which word extension has been applied can be outputted to the data output terminal (A/B[b:0]) of the target memory 21.

Figure 10:
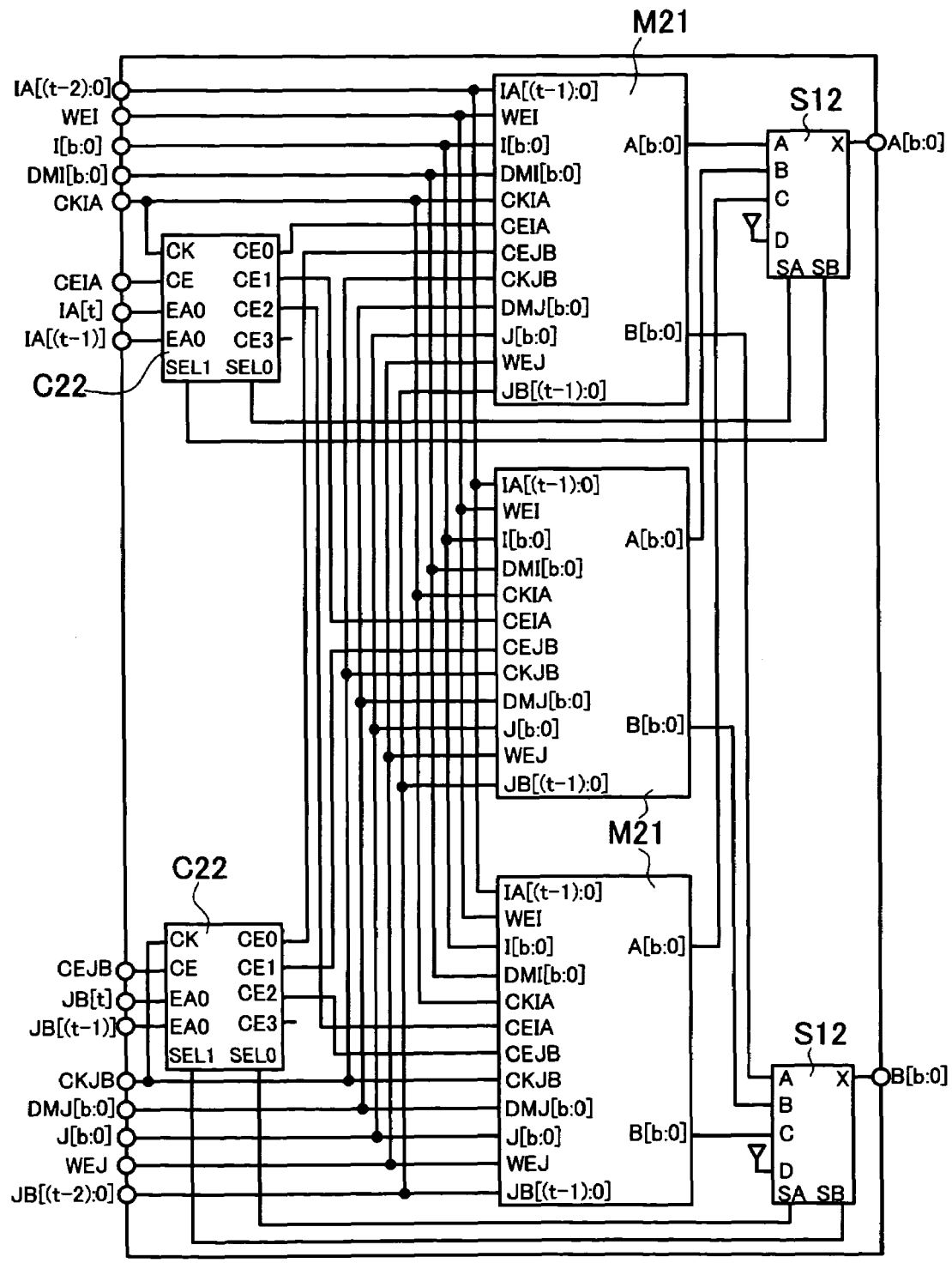
FIG. 10 is a specific example (2) of circuit structure created in accordance with the flows of FIG. 3 and FIG. 4.

FIG. 10 shows a specific example (2) of circuit structure created in accordance with flows of FIG. 3 and FIG. 4. FIG. 10 is a case that word extension for memory macros is made and a target memory is structured with plural memory macros. More specifically, it is a case that a target memory 22 has two-port input/output structure and word extension is made three times while bit width is not extended.

Firstly, word width ratio (WR) and bit width ratio (BR) are calculated ((S21) in FIG. 3). The specific example of FIG. 10 is a case that WR=3, BR=1. Minimum composing number is satisfied by structure of three sets of memory macros M21, M21, M21 extended in word direction. Therefore, a second control circuit C22 which has two terminals of macro selection terminals (EA0, EA1) and four terminals of macro activation control terminals (CE0 through CE3) is provided for each port. Furthermore, a selection control circuit S12 which has two terminals of selection terminals (SA, SB), four terminals of data input terminals (A through D), and a single terminal of data output terminal (X) is provided for each port of data output terminal (A/B[b:0]) for three sets of memory macro M21, M21, M21.

The second control circuit C22 has an enable terminal (CE) to be connected to an enable terminal (CEIA/CEJB) of a target memory 22. Similar to the case of FIG. 8, the selection terminals (SA, SB) of the selection control circuit S12 is connected to the control terminals (SEL0, SEL1) of the second control circuit C22. It is also possible to input highest-order address (IA/JB[t], IA/JB[t−1]) which have been inputted to the macro selection terminals (EA0, EA1) as input signals to the selection terminal (SA, SB).

Two-bit-high-order address (IA/JB[t], IA/JB[t−1]) have been inputted to the macro selection terminals (EA0, EA1) of the second control circuit C22 and one of the macro activation control terminals (CE0 through CE2) is activated depending on signal level. Two-bit-high-order address can output four types of signal but there is no memory macro connected corresponding to the macro activation control terminal (CE3). Therefore, there is not inputted logic combination of corresponding to high-order address (IA/JB[t], IA/JB[t−1]) as an unused terminal. The macro activation control terminals (CE0 through CE2) are connected to enable terminals (CEIA/CEJB) of each memory macro M21 and one of the memory macros M21 is activated. Three sets of memory macro M21, M21, M21 are distinguished depending on highest-order address (IA/JB[t], IA/JB[t−1]) and word structure is extended triple. Furthermore, the data input terminals (A through C) of the selection control circuit S12 are connected to data output terminals (A/B[b:0], A/B[b:0], A/B[b:0]) of the three sets of memory macro M21, M21, M21 for each port. Thereby, data from three sets of memory macro M21, M21, M21 to which word extension has been applied can be outputted to the data output terminal (A/B[b:0]) of the target memory 21.

Although it is not shown here, in case of bit extension, there may be used plural memory macros of which connections of input-side terminals, such as address terminal, data input terminal, control terminal, and the like, are same.

Figure 11:
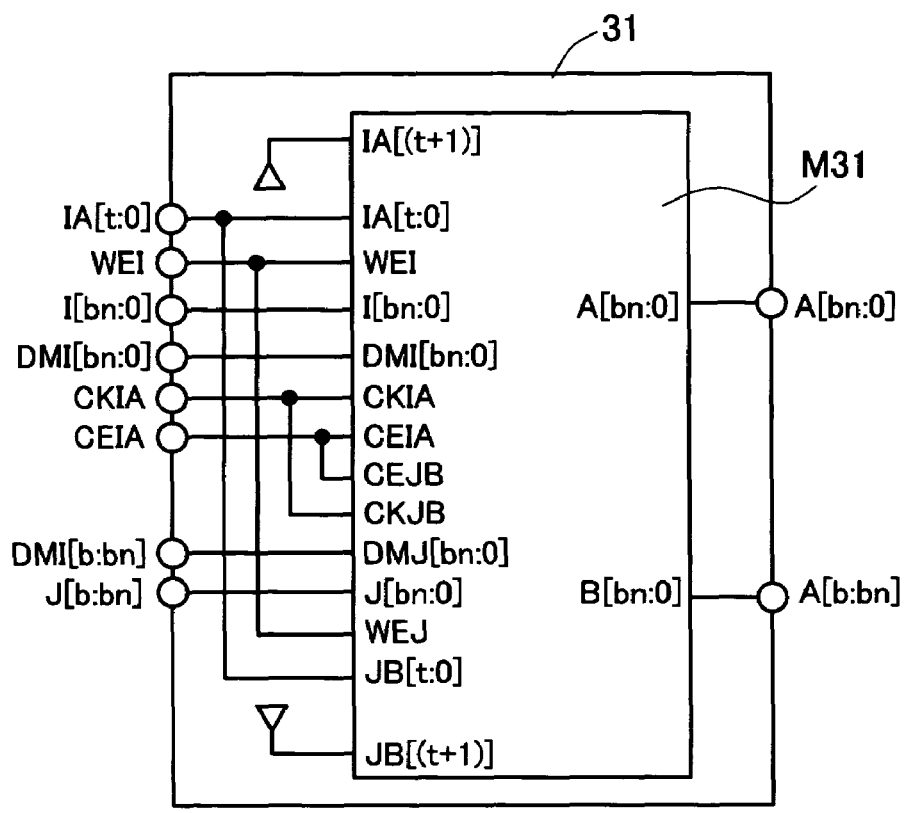
FIG. 11 is a specific example (1) of circuit structure created in accordance with the flows of FIG. 5 and FIG. 6.

FIG. 11 shows a specific example (1) of circuit structure created in accordance with flows of FIG. 5 and FIG. 6. FIG. 11 is a case that word reduction for memory macros is made and a memory macro is selected with the procedure at (S61). More specifically, it is a case that a target memory 31 has one-port input/output structure and word width is reduced to ½, bit width is extended double and two-port structured memory macro M31 is selected.

Dividable number (DP) determined by number of ports at the procedure (S45) in FIG. 5 is 2. Number of address (NA) object to word reduction at the procedure (S47) is 1, whereby dividable number (DW) due to word reduction at the procedure (S49) is determined to be 2. The highest-order address terminal (IA/JB[t+1]) of the memory macro M31 should be clipped at voltage level different by port, whereby memory region to be accessed by each port can be separated and data output from a data output terminal (A/B[bn:0]) of each port of the memory macro M31 in parallel becomes possible. By connecting the data output terminals (A[bn:0], B[bn:0]) to the data output terminals (A[bn:0], A[bn:0]) of the target memory 31, it becomes possible to output data of which bit width is extended double.

Figure 12:
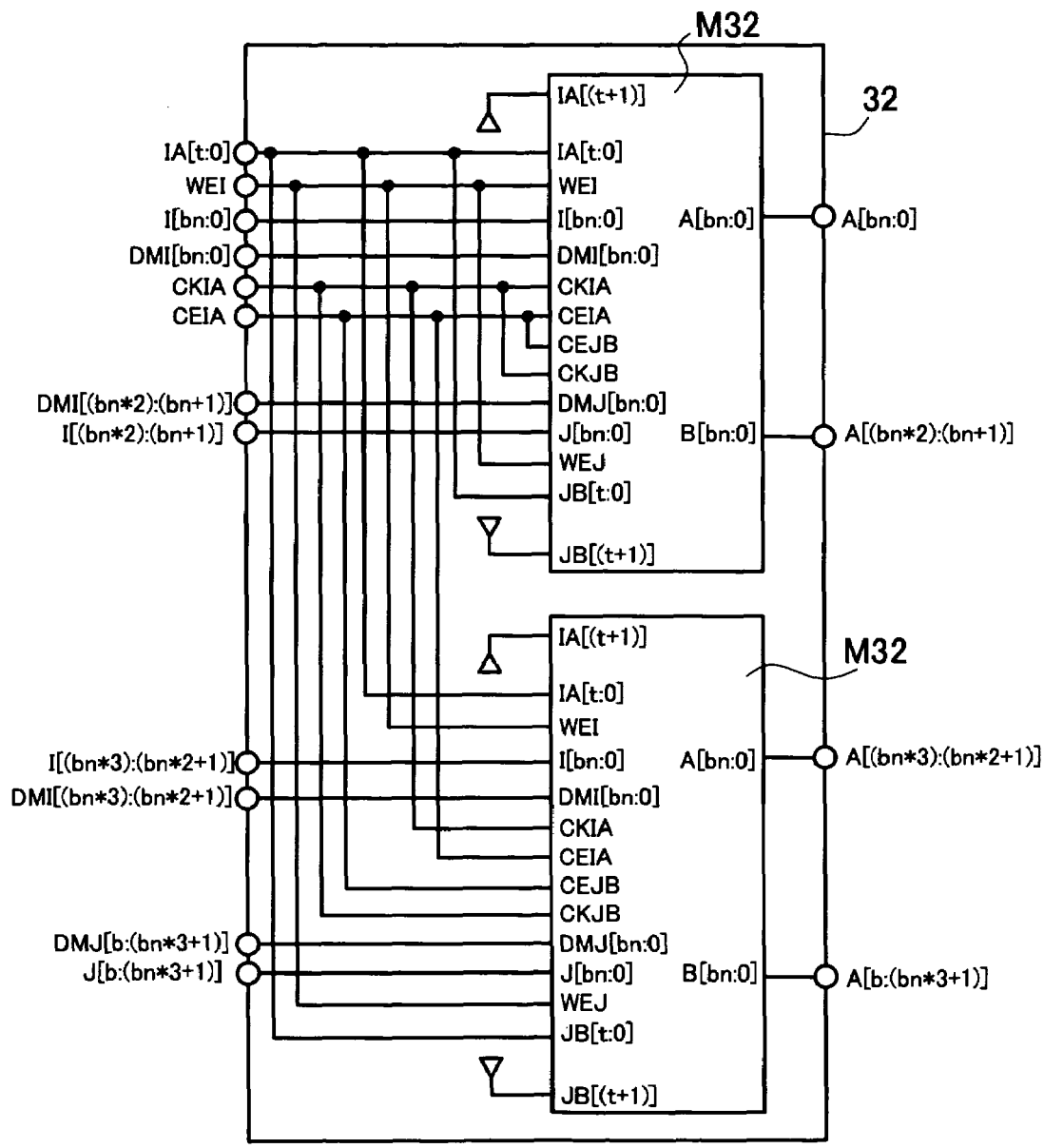
FIG. 12 is a specific example (2) of circuit structure created in accordance with the flows of FIG. 5 and FIG. 6.

FIG. 12 shows a specific example (2) of circuit structure created in accordance with flows of FIG. 5 and FIG. 6. FIG. 12 is a case that word reduction for memory macros is made and a memory macro is selected with the procedure at (S63). More specifically, it is a case that a target memory 32 has one-port input/output structure and word width is reduced to ½, bit width is extended four times and two sets of two-port structured memory macro M32 are selected.

Dividable number (DP) determined by number of ports at the procedure (S45) in FIG. 5 is 2. Number of address (NA) object to word reduction at the procedure (S47) is 1, whereby dividable number (DW) due to word reduction at the procedure (S49) is determined to be 2. The highest-order address terminal (IA/JB[t+1]) of the memory macro M32 should be clipped at logic level different by port, whereby memory region to be accessed by each port can be separated and bit structure extendable up to two times can be obtained by using a data output terminal (A/B[bn:0]) of each port of the memory macro M32. Since four-time of extension is required for the case of FIG. 12, it becomes possible to output data of which bit width is extended to four times by providing two sets of memory macro M32, M32 The specific examples (1) and (2) directed to FIG. 11 and FIG. 12, respectively, describe cases that dividable number (DW) due to word reduction and dividable number (DP) determined by number of ports are same. However, the present invention is not restricted to the above cases. For example, in case of DW>DP where number of address (NA) object of word reduction becomes larger than number of address for distinguishing ports, address terminals of address other than address for distinguishing ports are preferably clipped at predetermined potential as unused input terminal. In case of DW<DP where number of address (NA) object to word reduction becomes smaller than number of address for distinguishing ports, word reduction can be executed within range of number of address for distinguishing ports.

Figure 13:
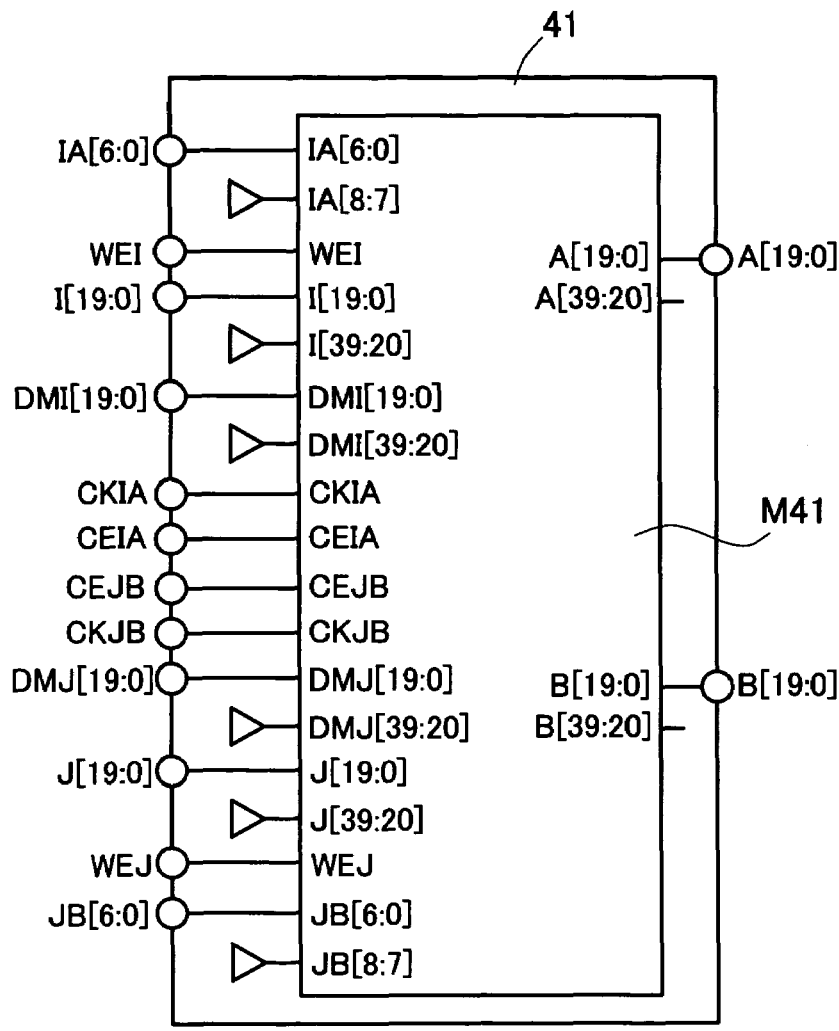
FIG. 13 is a specific example (3) of circuit structure created in accordance with the flows of FIG. 5 and FIG. 6.

FIG. 13 shows a specific example (3) of circuit structure created in accordance with flows of FIG. 5 and FIG. 6. FIG. 13 is a case that word reduction for memory macros is made and a memory macro is selected with the procedure at (S59) through condition-coincidence check procedure at (S43). More specifically, it is a case that a target memory 41 is 128 words/20 bits with two-port input/output structure and a memory macro M41 is 512 words/40 bits with two-port input/output structure Second bit width ratio (BR2) is BR2=20/40=0.5, which is rounded up as BR2=1. Through the procedure (S59), a memory macro M41 of 512-word-width as macro word width closes to target word width (128 words) is selected. Composing number is 1. Since bit width is reduced from 40 bits to 20 bits, unused input terminals are clipped at predetermined level and unused data output terminals are not connected.

Figure 14:
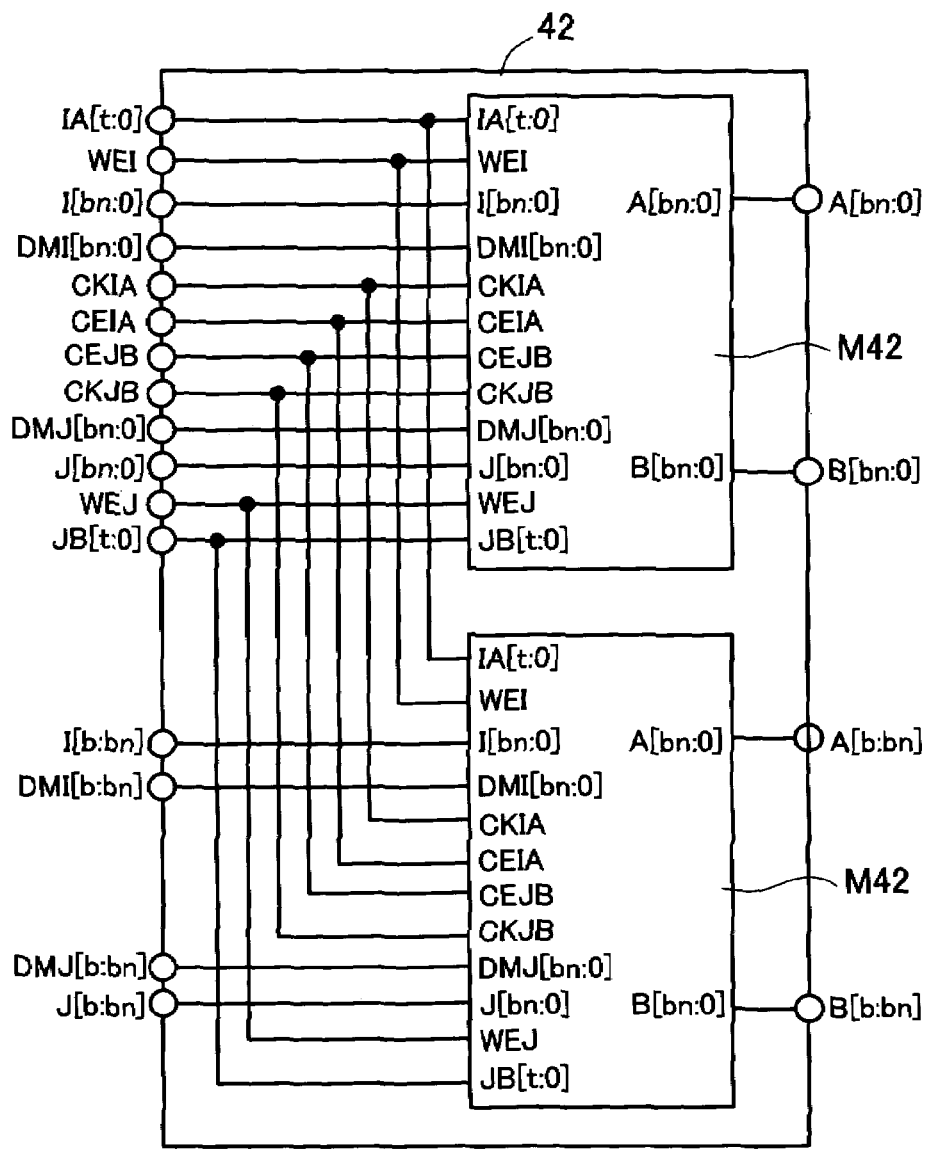
FIG. 14 is a specific example (4) of circuit structure created in accordance with the flows of FIG. 5 and FIG. 6.

FIG. 14 shows a specific example (4) of circuit structure created in accordance with flows of FIG. 5 and FIG. 6. FIG. 14 is a case that word reduction for memory macros is made and a memory macro is selected with the procedure at (S59) through condition-coincidence check procedure at (S55). More specifically, it is a case that there is no dividable memory macro for a target memory 42 so a memory macro M42 is selected and its bit width is extended double.

Through the procedure (S59), the memory macro M42 of which word width is same as target word width is selected as macro word width closest to the target word width. Since bit width is extended double, composing number is 2. Each data output terminal (A/B[bn:0], A/B[bn:0]) of the two sets of memory macro M42, M42 is connected to data output terminals (A/B[bn:0], A/B[b:bn]) of the target memory 42.

Figure 15:
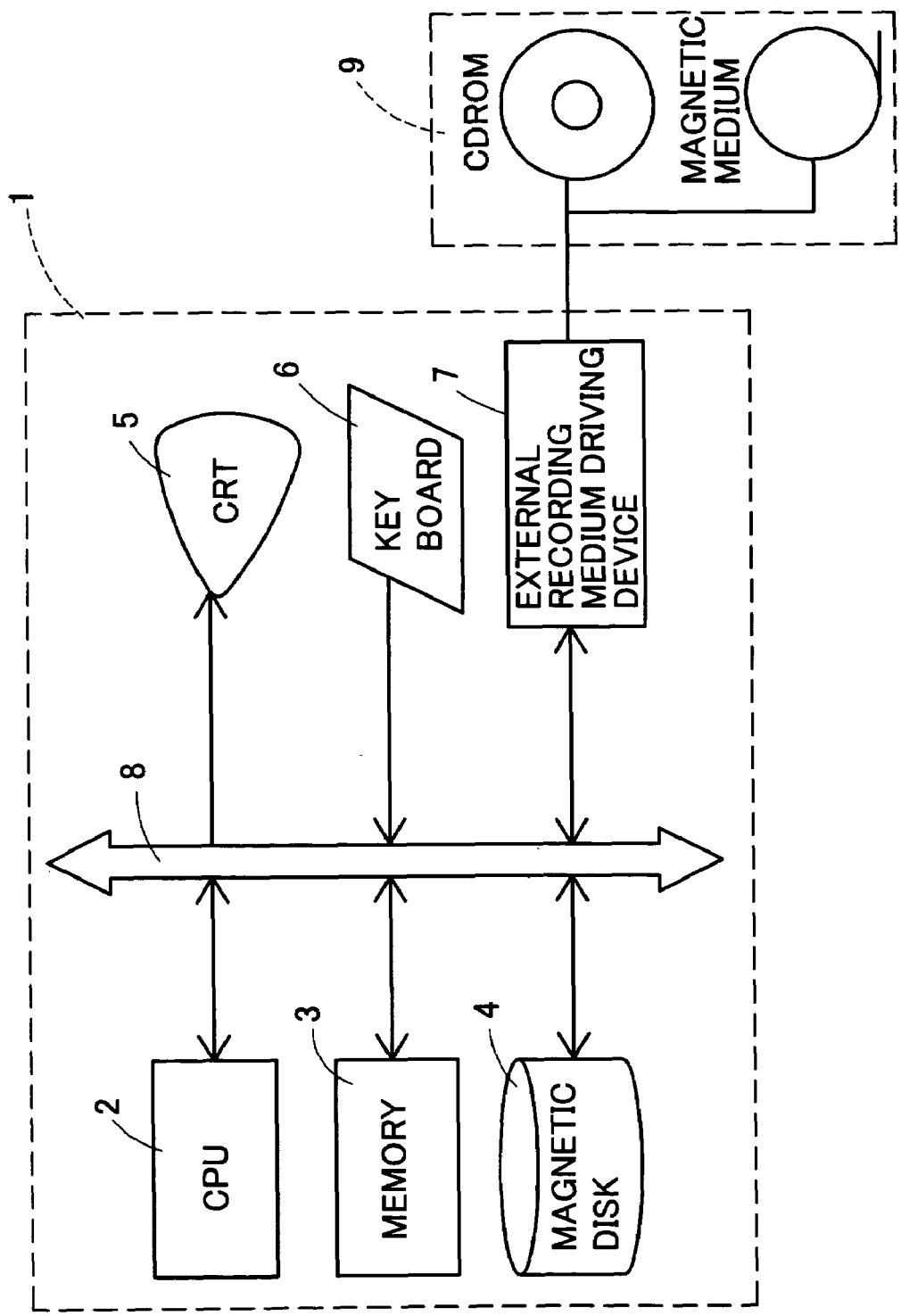
FIG. 15 shows structure of net list creating device directed to the embodiment.
Figure 16:
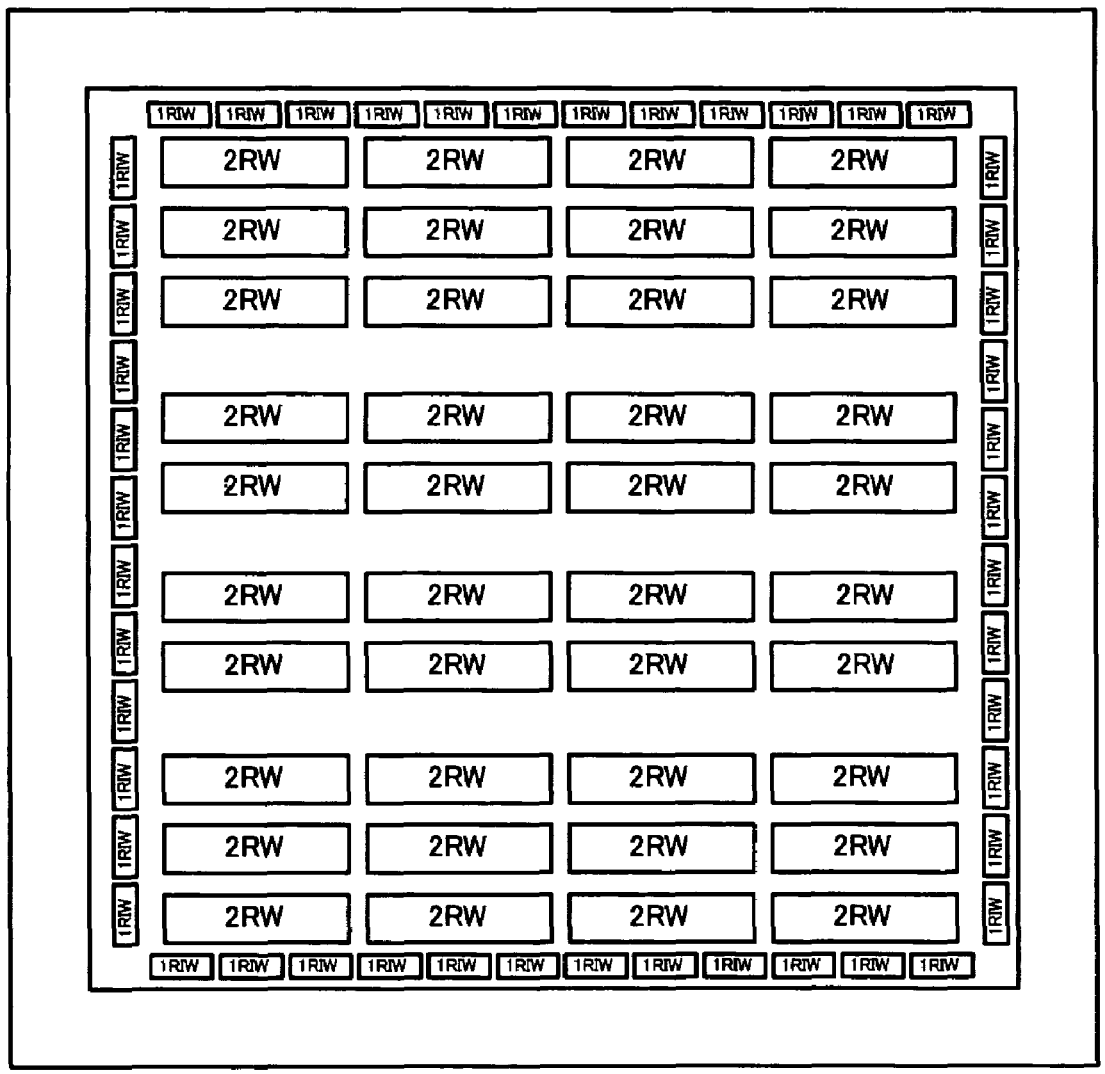
FIG. 16 is memory macro layout of structured ASIC.

FIG. 15 shows a net list creating device 1. The net list creating device 1 is structured such that a central processing unit (abbreviated as CPU, herein after) 2, a memory 3, a magnetic disk 4, a display device (abbreviated as CRT, hereinafter) 5, a key board 6 and an external recording medium driving device 7 are connected mutually via a bus 8 and an external recording medium 9 such as CDROM, magnetic medium and the like, is attached to the external recording medium driving device 7 removably.

Computer program for executing flows of net list creation shown in FIG. 1 through FIG. 6 is stored in the memory 3 and the magnetic disk device in the net list creating device 1. In case stored in the external recording device 9 such as CDROM, magnetic medium and the like, the program is stored in the memory 3 or the magnetic disk device 4 or transferred to the CPU 2 directly. Furthermore, a memory macro library (D1), control library (D3) are stored in the memory 2, the magnetic disk device 4 or in the external recording device 9 such as CDROM, magnetic medium and the like, or directly stored in the CPU 2. In accordance with computer program's processing for executing net list creating flow directed to FIG. 1 through FIG. 6, program is referred on demand by command from CPU 2. Furthermore, condition designation information (I1) is inputted from the key board 6 or inputted from the external recording medium 9 through the external recording medium driving device 7.

Although it is not shown in FIG. 15, it is possible to receive/send the above described computer program and various information between system through electronic communication circuits such as internet and the like.

As described, according to inventive net list creating method and computer program thereof, net list information of a control circuit required for controlling memory macros to realize a target memory is stored in a control library depending on memory macro library to be used for a chip frame in accordance with macro word width which is word width of a memory macro and target word width which is word width of a target memory. When a target memory is structure by combining memory macros, extension/reduction of word width, extension/reduction of bit width are judged in order and unused memory regions are suppressed to essential minimum with minimum composing number of memory macro(s). Thereby, a target memory can be composed with optimum structure. Since a control library is previously provided, it is not necessary to design a control circuit so as to meet with structure of a target memory for each combination of memory macros. Therefore, a target memory can be realized with minimum composing number of memory macro(s) to avoid making useless memory region. Furthermore, it does not take time to design a control circuit for meeting with a target memory at the time of combining memory macros.

Not to mention, the present invention is not restricted to the afore-mentioned embodiments but there may be various improvements and variation as long as not departing from the gist of the present invention.

For example, although the embodiment describes a case that memory macros are provided for structuring a target memory, the present invention is not restricted to such a case. The present invention is applicable to cases such that a target circuit structure can be obtained by combining IP macros such as register file, and the like.

According to the present invention, for realizing a required target memory, it is not required to re-design a control circuit which selects minimum required number of memory macros and controls to make the selected memory macros accessible as target memory. Accordingly, there can be provided net list creating method, net list creating device, and computer program thereof capable of creating net list of a target memory within a short time with a minimum required occupancy area.

What is claimed is:

1. A net list creating method for structuring a target memory by using memory macro(s) previously arranged in each chip frame, the net list creating method comprising:
 a step of comparing a target word width directed to the target memory and a macro word width directed to the memory macro(s);
 a step of calculating a first word width ratio, the target word width to a maximum macro word width, and a first bit width ratio, a bit width of the target memory to a bit width of a memory macro that has the maximum macro word width, in case the target word width is larger than a maximum value of the macro word width; and
 a step of selecting a memory macro that has the maximum macro word width on condition that the first word width ratio is 2n (n: natural number) and the first bit width ratio is 2(−n) or lower, or selecting a memory macro that has a minimum composing number among a required number of memory macros calculated from a product of word width ratio and bit width ratio of the target memory to the memory macro in case the aforementioned condition is not satisfied.

2. The net list creating method according to claim 1, wherein, in case there exist plural memory macros of which the required number of memory macro is the minimum composing number, a memory macro of which word width ratio, word width of the target memory to that of the memory macro, is smallest is selected among the plural memory macros.

3. The net list creating method according to claim 1, wherein a predetermined potential is applied to unused input terminals of the memory macro when the target memory is structured in accordance with a memory macro to be selected.

4. The net list creating method according to claim 3, wherein unused data input terminals out of the unused input terminals are connected to used data input terminals.

5. The net list creating method according to claim 1, wherein unused output terminals of the memory macro are made not to be connected when the target memory is structured in accordance with a memory macro to be selected.

6. The net list creating method according to claim 1 further comprising a memory macro library in which structure information such as a word width and a bit width of the memory macro is stored by each of the chip frame.

7. The net list creating method according to claim 1 further comprising a control library in which net list information of a control circuit which outputs a control signal in response to a word select signal for selecting a word region divided by each of the macro word width among the target word width and controls memory macros which constitutes the target memory,
 wherein, in case a memory macro which has the maximum macro word width is selected, the control library includes a first control circuit for outputting a mask control signal to a data mask terminal of the memory macro with leaving a bit width of the target memory in response to the word select signal.

8. The net list creating method according to claim 7, wherein a data mask signal to be inputted to the target memory is allocated to a data mask terminal to which the mask control signal is not inputted.

9. The net list creating method according to claim 7, wherein, in case a memory macro which has the maximum macro word width is selected, the control library includes a selection control circuit for selecting a data output terminal among data output terminals of the memory macro depending on a bit width of the target memory, in response to the word select signal.

10. The net list creating method according to claim 7, wherein the word select signal is predetermined-numbered-bit high-order address for word selection.

11. The net list creating method according to claim 1 further comprising a control library in which net list information of a control circuit which outputs a control signal in response to a word select signal for selecting a word region divided by each of the macro word width among the target word width and controls memory macros which constitutes the target memory,
 wherein, in case a memory macro which has a minimum composing number is selected, the control library includes a second control circuit for selectively activating the memory macro in response to the word select signal.

12. The net list creating method according to claim 11, wherein, in case a memory macro which has a minimum composing number is selected, the control library includes a selection control circuit for selecting a data output terminal of a memory macro to be selected in response to the word select signal.

13. The net list creating method according to claim 11, wherein the word select signal is predetermined-numbered-bit high-order address for word selection.

14. A net list creating method for structuring a target memory by using memory macro(s) previously arranged in each chip frame, the net list creating method comprising:
- a step of comparing a target word width directed to the target memory and a macro word width directed to the memory macro(s);
- a step of calculating a second bit width ratio, a bit width of the target memory to a bit width of the memory macro, in case the target word width is same as a maximum value of the macro word width or lower and a memory macro has a word width same as or wider than the target word width;
- a step of checking whether or not division of the memory macro for extending a bit width is possible in case the second bit width ratio is larger than 1,
- a step of selecting a memory macro that has a minimum composing number among combinations of the second bit width ratio and a dividable number of the memory macro in case the memory macro is dividable; and
- a step of selecting a memory macro of which macro word width is closest to the target word width in case there is a memory macro in which the second bit width ratio is 1 or in case the second bit width ratio is larger than 1 and division of a memory macro is impossible.

15. The net list creating method according to claim 14, wherein, in case there exist plural memory macros of which the dividable number is same as the second bit width ratio or larger, a memory macro of which the dividable number is minimum is selected among the plural memory macros.

16. The net list creating method according to claim 14, wherein, in case the dividable number is smaller than the second bit width ratio, a memory macro of which the dividable number is largest and macro word width is closest to the target word width is selected among the plural memory macros.

17. The net list creating method according to claim 14, wherein the dividable number corresponds to smaller number between port number ratio, port number of the memory macro to port number of the target memory macro, and word width ratio, the macro word width to the target word width.

18. The net list creating method according to claim 14, wherein a predetermined potential is applied to unused input terminals of the memory macro when the target memory is structured in accordance with a memory macro to be selected.

19. The net list creating method according to claim 18, wherein unused data input terminals out of the unused input terminals are connected to used data input terminals.

20. The net list creating method according to claim 14, wherein unused output terminals of the memory macro are made not to be connected when the target memory is structured in accordance with a memory macro to be selected.

21. The net list creating method according to claim 14 further comprising a memory macro library in which structure information such as a word width and a bit width of the memory macro is stored by each of the chip frame.

22. A net list creating device for structuring a target memory by using memory macro(s) previously arranged in each chip frame, the net list creating device comprising:
- a word width comparator section for comparing a target word width directed to the target memory and a macro word width directed to the memory macro(s);
- a word-width/bit-width calculator section for calculating a first word width ratio, the target word width to a maximum macro word width, and a first bit width ratio, a bit width of the target memory to a bit width of a memory macro that has the maximum macro word width, in case the target word width is larger than a maximum value of the macro word width; and
- a macro selector section for selecting a memory macro that has the maximum macro word width on condition that the first word width ratio is 2n (n: natural number) and the first bit width ratio is 2(−n) or lower, or selecting a memory macro that has a minimum composing number among a required number of memory macros calculated from a product of word width ratio and bit width ratio of the target memory to the memory macro in case the afore-mentioned condition is not satisfied.

23. A net list creating device for structuring a target memory by using memory macro(s) previously arranged in each chip frame, the net list creating device comprising:
- a word width comparator section for comparing a target word width directed to the target memory and a macro word width directed to the memory macro(s);
- a bit width calculator section for calculating a second bit width ratio, a bit width of the target memory to a bit width of the memory macro, in case the target word width is same as a maximum value of the macro word width or lower and a memory macro has a word width same as or wider than the target word width;
- a macro division judge section for judging whether or not division of the memory macro for extending a bit width is possible in case the second bit width ratio is larger than 1,
- a first macro select section for selecting a memory macro that has a minimum composing number among combinations of the second bit width ratio and a dividable number of the memory macro in case the memory macro is dividable; and
- a second macro select section for selecting a memory macro of which macro word width is closest to the target word width in case there is a memory macro in which the second bit width ratio is 1 or in case the second bit width ratio is larger than 1 and division of a memory macro is impossible.

24. A computer-readable medium encoded with a computer program of net list creation for structuring a target memory by using memory macro(s) previously arranged in each chip frame to perform a method comprising:
- a step of comparing a target word width directed to the target memory and a macro word width directed to the memory macro(s);
- a step of calculating a first word width ratio, the target word width to a maximum macro word width, and a first bit width ratio, a bit width of the target memory to a bit width of a memory macro that has the maximum macro word width, in case the target word width is larger than a maximum value of the macro word width; and
- a step of selecting a memory macro that has the maximum macro word width on condition that the first word width ratio is 2n (n: natural number) and the first bit width ratio is 2(−n) or lower, or selecting a memory macro that has a minimum composing number among a required number of memory macros calculated from a product of word width ratio and bit width ratio of the target memory to the memory macro in case the aforementioned condition is not satisfied.

25. A computer-readable medium encoded with a computer program of net list creation for structuring a target memory by using memory macro(s) previously arranged in each chip frame to perform a method comprising:

a step of comparing a target word width directed to the target memory and a macro word width directed to the memory macro(s);

a step of calculating a second bit width ratio, a bit width of the target memory to a bit width of the memory macro, in case the target word width is same as a maximum value of the macro word width or lower and a memory macro has a word width same as or wider than the target word width;

a step of checking whether or not division of the memory macro for extending a bit width is possible in case the second bit width ratio is larger than 1, a step of selecting a memory macro that has a minimum composing number among combinations of the second bit width ratio and a dividable number of the memory macro in case the memory macro is dividable; and a step of selecting a memory macro of which macro word width is closest to the target word width in case there is a memory macro in which the second bit width ratio is 1 or in case the second bit width ratio is larger than 1 and division of a memory macro is impossible.

* * * * *